(12) United States Patent
Wexler et al.

(10) Patent No.: US 9,235,128 B2
(45) Date of Patent: Jan. 12, 2016

(54) FORMING PATTERNS USING CROSSLINKABLE REACTIVE POLYMERS

(71) Applicants: Allan Wexler, Pittsford, NY (US); Grace Ann Bennett, Scottsville, NY (US); Kimberly S. Lindner, Rochester, NY (US)

(72) Inventors: Allan Wexler, Pittsford, NY (US); Grace Ann Bennett, Scottsville, NY (US); Kimberly S. Lindner, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 118 days.

(21) Appl. No.: 14/084,711

(22) Filed: Nov. 20, 2013

(65) Prior Publication Data
US 2015/0140481 A1 May 21, 2015

(51) Int. Cl.
*G03F 7/038* (2006.01)
*G03F 7/26* (2006.01)
*G03F 7/004* (2006.01)
*G03F 7/105* (2006.01)

(52) U.S. Cl.
CPC ........ *G03F 7/26* (2013.01); *G03F 7/004* (2013.01); *G03F 7/038* (2013.01); *G03F 7/105* (2013.01)

(58) Field of Classification Search
CPC ........... G03F 7/004; G03F 7/26; G03F 7/105; G03F 7/038; G03F 7/0382
USPC ........................ 430/17, 18, 291, 292, 270.1
See application file for complete search history.

(56) References Cited

U.S. PATENT DOCUMENTS

| | | | |
|---|---|---|---|
| 3,137,668 A | 6/1964 | Kuppers | |
| 5,512,131 A | 4/1996 | Kumar et al. | |
| 5,928,840 A | 7/1999 | Matsuo et al. | |
| 6,017,683 A | 1/2000 | Endo et al. | |
| 6,379,863 B1 | 4/2002 | Oohashi et al. | |
| 6,887,332 B1 | 5/2005 | Kagan et al. | |
| 7,220,452 B2 | 5/2007 | Hammond Cunningham et al. | |
| 7,795,145 B2 | 9/2010 | Gomez et al. | |
| 7,846,642 B2 | 12/2010 | Ofir et al. | |
| 8,652,640 B2 | 2/2014 | Santore et al. | |
| 2007/0246249 A1 | 10/2007 | Kano et al. | |
| 2008/0261006 A1 | 10/2008 | McCarty et al. | |

FOREIGN PATENT DOCUMENTS

| | | | |
|---|---|---|---|
| EP | 0 773 478 A1 | | 5/1997 |
| JP | 2013-028772 A | * | 2/2013 |
| WO | 2008/045745 | | 4/2008 |

OTHER PUBLICATIONS

Computer-generated translation of JP 2013-028772 (Feb. 2013).*
Yong Hoon Kim, et al., "Selective Assembly of colloidal Particles on a Nanostructured Template Coated with Polyelectrolyte Multilayers," Adv. Mater. 2007, 19, 4426-4430.
Joanna Aizenberg, et al., "Patterned Colloidal Deposition Controlled by Electrostatic and Capillary Forces," Physical Review Letters, vol. 84, No. 13, Mar. 27, 2000, 2997-3000.
Masamitsu Shirai, et al., "Photo-assisted thermal crosslinking of polymers having imino sulfonate units," Reactive & Functional Polymers 37 (1998) 147-154.

* cited by examiner

*Primary Examiner* — John A McPherson
(74) *Attorney, Agent, or Firm* — J. Lanny Tucker

(57) ABSTRACT

Various patterning methods utilize certain crosslinkable reactive polymers comprise -A- and -B- recurring units, arranged randomly along a backbone. The -A- recurring units comprise pendant aromatic sulfonic acid oxime ester groups that are capable of providing pendant aromatic sulfonic acid groups upon irradiation with radiation having a $\lambda_{max}$ of at least 150 nm and up to and including 450 nm. The -A- recurring units are present in the reactive polymer in an amount of up to and including 98 mol % based on total reactive polymer recurring units. The -B- recurring units comprise pendant groups that provide crosslinking upon generation of the aromatic sulfonic acid groups in the -A- recurring units. The -B- recurring units are present in an amount of at least 2 mol %, based on total reactive polymer recurring units.

18 Claims, No Drawings

FORMING PATTERNS USING CROSSLINKABLE REACTIVE POLYMERS

RELATED APPLICATIONS

Copending and commonly assigned U.S. Ser. No. 14/084,675 filed on Nov. 20, 2013, by Wexler, Bennett, and Lindner, and entitled "Crosslinkable Reactive Polymers."

Copending and commonly assigned U.S. Ser. No. 14/084,693 filed on Nov. 20, 2013, by Irving, Wexler, Bennett, and Lindner and entitled "Forming Conductive Metal Pattern Using Reactive Polymers."

Copending and commonly assigned U.S. Ser. No. 14/084,732 filed on Nov. 20, 2013, by Irving and entitled "Electroless Plating Method."

Copending and commonly assigned U.S. Ser. No. 14/084,755 filed on Nov. 20, 2013, by Irving and entitled "Electroless Plating Method Using Bleaching."

Copending and commonly assigned U.S. Ser. No. 14/084,969 filed on Nov. 20, 2013, by Irving and entitled "Electroless Plating Method Using Halide."

Copending and commonly assigned U.S. Ser. No. 14/085,030 filed on Nov. 20, 2013, by Irving and entitled "Electroless Plating Method Using Non-Reducing Agent."

FIELD OF THE INVENTION

This invention relates to the use of crosslinkable reactive polymers that upon appropriate irradiation provide reactive aromatic sulfonic acid sites, to form various patterns for example using cationic dyes or charged inorganic particles in ion exchange processes.

BACKGROUND OF THE INVENTION

The development of two-dimensional and three-dimensional structures composed of colloidal particles has been the focus of considerable research and development in recent years with respect to their various potential uses. For example, it is possible that articles comprising a pattern of colloidal particles may be useful in biochip devices and sensors, optoelectronic devices, and photonic bandgap materials. Micro- or nanoscale physical patterns can be prepared using photolithography, electron-beam lithography, ion-beam etching, flexography, and functional printing. The desire with any of these technologies is to provide accurately patterned colloidal particles or clusters of particles on a nanoscale. Attempts to accomplish this have been directed to the use of various functionalized colloidal particles having different charges.

For example, selective assembly of colloidal particles on a nanostructured template coated with multilayers of electrolytes is described by Kim et al. *Adv. Mater.* 2007, 19, 4426-4430.

Patterned articles with anionic and cationic regions are prepared using controlled electrostatic and capillary forces as described by Aizenberg et al., *Phys. Rev. Lett.* 2000, 84(13), 2997-3000.

WO 2008/045745 (McCarty et al.) describes self-assembled articles having a surface comprising immobilized particles having ionic functional groups of one type of charge and mobile counterion of another type of charge. It is said that such charged materials may be useful to direct electrostatic self-assembly of surfaces, microspheres, or other materials on a micro- or nanoscale.

Other technologies have been developed to provide microfabrication methods for making metallic, two-dimensional, and three-dimensional structures with conductive metals. Conductive patterns have been provided for these purposes using photolithography and imaging through mask materials as described for example of U.S. Pat. No. 7,399,579 (Deng et al.).

There is a need to find a simplified way to increase the selective deposition onto charged patterned materials particularly to form with high contrast ionic charge patterns.

SUMMARY OF THE INVENTION

The present invention provides a method comprising:

providing a polymeric layer comprising a copolymer that comprises a backbone of at least -A- and -B- recurring units, all recurring units being arranged randomly along the backbone, wherein the -A- recurring units comprise pendant groups that are capable of providing pendant aromatic sulfonic acid groups upon irradiation with radiation having a $\lambda_{max}$ of at least 150 nm and up to and including 450 nm, the -A- recurring units being present in the copolymer in an amount up to and including 98 mol % based on total copolymer recurring units, and the -B- recurring units comprise pendant groups that can provide crosslinking upon generation of the aromatic sulfonic acid groups in the -A- recurring units, the -B- recurring units being present in the copolymer in an amount of at least 2 mol %, based on total copolymer recurring units, and patternwise exposing the polymeric layer to radiation having a $\lambda_{max}$ of at least 150 nm and up to and including 450 nm to provide pendant sulfonic acid groups in the copolymer and to provide crosslinking in the copolymer in the exposed regions of the polymeric layer.

In particularly useful embodiments, the method of this invention can further comprise:

neutralizing the pendant sulfonic acid groups in the exposed regions of the polymeric layer to provide pendant neutralized sulfonic acid groups, contacting both the exposed and non-exposed regions of the polymeric layer with a polycationic colorant that ionically binds to at least some of the pendant neutralized sulfonic acid groups in the exposed regions of the polymeric layer, and that adsorbs to the polymeric layer in the non-exposed regions, and washing the polymeric layer with an aqueous solution to remove non-bound polycationic colorant from the exposed regions of the polymeric layer and non-adsorbed polycationic colorant from the non-exposed regions of the polymeric layer.

Some of such particularly useful embodiments can further comprise, after washing the polymeric layer:

contacting the polymeric layer with positively-charged colloidal particles that adhere to the exposed regions of the polymeric layer having adsorbed polycationic colorant, and again washing the polymeric layer to remove non-adhering positively-charged colloidal particles from the non-exposed regions of the polymeric layer.

Alternatively, other particularly useful embodiments further comprise after washing the polymeric layer:

contacting the polymeric layer with negatively-charged colloidal particles that adhere to the non-exposed regions of the polymeric layer, and again washing the polymeric layer to remove non-adhering negatively-charged colloidal particles from the exposed regions of the polymeric layer.

The present invention also provides an intermediate article comprising a substrate and having disposed thereon a dry polymeric layer comprising exposed regions and non-exposed regions, the exposed regions of the dry polymeric layer comprising a de-blocked, crosslinked, and neutralized copolymer comprising reacted -A- recurring units and reacted -B- recurring units, and neutralized pendant sulfonic acid groups in the reacted -A- recurring units to which a polycationic colorant is ionically bound, and the non-exposed regions of the dry polymeric layer comprising a non-crosslinked copolymer that comprises a backbone of at least -A- and -B- recurring units arranged randomly along the backbone, the -A- recurring units comprising pendant groups that are capable of providing pendant aromatic sulfonic acid groups upon irradiation at radiation having a $\lambda_{max}$ of at least 150 nm and up to and including 450 nm, the -A- recurring units being present in the copolymer in an amount of up to and including 98 mol % based on total copolymer recurring units, and the -B- recurring units comprising pendant groups that can provide crosslinking upon generation of the pendant aromatic sulfonic acid groups in the -A- recurring units, the -B- recurring units being present in an amount of at least 2 mol %, based on total copolymer recurring units, and the non-exposed regions of the dry polymeric layer also having the polycationic colorant adsorbed thereto.

In addition, the present invention provides an article comprising a substrate and having disposed thereon a dry polymeric layer comprising exposed and non-exposed regions, the exposed regions of the dry polymeric layer comprising a de-blocked, crosslinked, and neutralized copolymer comprising reacted -A- recurring units and reacted -B- recurring units, and neutralized pendant sulfonic acid groups in the reacted -A- recurring units to which a polycationic colorant is ionically bound, and the non-exposed regions of the dry polymeric layer comprising a non-crosslinked copolymer that comprises a backbone of at least -A- and -B- recurring units arranged randomly along the backbone, the -A- recurring units comprising pendant groups that are capable of providing pendant aromatic sulfonic acid groups upon irradiation to radiation having a $\lambda_{max}$ of at least 150 nm and up to and including 450 nm, the -A- recurring units being present in the non-crosslinked copolymer in an amount of up to and including 98 mol % based on total non-crosslinked copolymer recurring units, and the -B- recurring units comprising pendant groups that can provide crosslinking upon generation of the aromatic sulfonic acid groups in the -A- recurring units, the -B- recurring units being present in the non-crosslinked copolymer in an amount of at least 2 mol %, based on total non-crosslinked copolymer recurring units, and the non-exposed regions of the dry polymeric layer further comprising negatively-charged colloidal particles and adsorbed polycationic colorant.

Further, an article comprises a substrate and having disposed thereon a dry polymeric layer comprising exposed and non-exposed regions, the exposed regions of the dry polymeric layer comprising a de-blocked, crosslinked, and neutralized copolymer comprising neutralized pendant sulfonic acid groups to which are adhered positively-charged colloidal particles, and the non-exposed regions of the dry polymeric layer comprising a non-crosslinked copolymer that comprises a backbone of at least -A- and -B- recurring units arranged randomly along the backbone, the -A- recurring units comprising pendant groups that are capable of providing pendant aromatic sulfonic acid groups upon irradiation with radiation having a $\lambda_{max}$ of at least 150 nm and up to and including 450 nm, the -A- recurring units being present in the non-crosslinked copolymer in an amount of up to and including 98 mol % based on total non-crosslinked copolymer recurring units, and the -B- recurring units comprising groups that can provide crosslinking upon generation of the aromatic sulfonic acid groups in the -A- recurring units, the -B- recurring units being present in the non-crosslinked copolymer in an amount of at least 2 mol %, based on total non-crosslinked copolymer recurring units, and the non-exposed regions of the dry polymeric layer further comprising adsorbed polycationic colorant.

The present invention provides a number of advantages for providing charged patterns on various substrates such as glass, quartz, or polymeric films. The method of this invention can be used selectively to deposit ionically charged materials such as ionically charged colloidal materials from aqueous-based solutions only charged elements (or patterned substrates) when surrounding regions are oppositely charged. For example, the present invention can be used to patternwise deposit negatively-charged particles (such as negatively-charged silica particles) on a neutral or positively-charged background substrate. Positively-charged particles can be similarly patternwise deposited on a neutral or negatively-charged background substrate. The deposited particulate metallic or non-metallic patterns can then be used to attract oppositely charged molecules for visual identification or manipulation.

These advantages have been achieved by using a unique crosslinkable reactive polymer that upon irradiation can be used to form desired charged regions and crosslinking of the polymer in those regions. More specifically, the crosslinkable reactive polymers comprise a high concentration of aromatic sulfonic acid-generating recurring units and a relatively low concentration of recurring units that can be de-blocked and provide crosslinking in the presence of the generated sulfonic acid groups. This unique combination of recurring units provides, upon UV irradiation, pendant aromatic sulfonic acid groups and sulfonic acid-generated polymer crosslinking. Moreover, the high level of pendant aromatic sulfonic acid groups can be neutralized, for example using an alkali metal cation and the neutralized sulfonate groups in the crosslinked polymer to be used in various ion exchange processes and ionic pattern formation.

When patternwise imaged, pendant aromatic sulfonic acid groups are formed in a patternwise manner, which pendant aromatic sulfonic acid groups can be neutralized to form pendant aromatic sulfonate groups in the swellable pattern ("switched" regions). The polymer is also crosslinked in the imaged (exposed) regions using the acid-generated crosslinkable groups so that the neutralized polymer is not readily washed off a substrate.

When this imaged (exposed) polymer is then treated with a polycationic dye (or other cationic molecule), the non-exposed regions of the crosslinkable reactive polymer (no pendant sulfonate groups present) absorb the polycationic dye to provide a cationic surface while the surrounding exposed regions (with de-blocked aromatic sulfonate groups) imbibe the polycationic colorant but remain anionic in nature. This process therefore provides, in one step, a high contrast ionic charge pattern that is highly selective for the deposition of colloidal materials. Further details of such method and its advantages are provided below in the following detailed description including the working examples.

Because the crosslinkable reactive polymers used in this invention can be formed into relatively thin films, the resulting patterns formed in the thin films can be used in many different articles that can be exposed and used in various ways. For example, the exposed, de-blocked, and crosslinked polymers can be used in various ion exchange methods, including but not limited to exchange with various organic and inorganic ions facilitating electroless plating of metals. In addition, the charges produced in the exposed and crosslinked thin films of the polymers can be used for electrostatic attraction of various organic and inorganic particles including particles having opposite surface charges.

DETAILED DESCRIPTION OF THE INVENTION

Definitions

As used herein to define various ethylenically unsaturated polymerizable monomer components used to prepare the reactive polymers, neutralized polymers, coating solutions, formulations, aqueous-based solutions, and coated layers, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard dictionary.

The use of numerical values in the various ranges specified herein, unless otherwise expressly indicated otherwise, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

Unless otherwise indicated, the term "weight %" refers to the amount of a component or material based on the total solids of a composition, formulation, or layer. Unless otherwise indicated, the percentages can be the same for either a dry layer or pattern, or for the total solids of the formulation or composition.

The term "homopolymer" is meant to refer to polymers that have the same repeating or recurring unit along a polymer backbone. The term "copolymer" refers to polymers composed of two or more different repeating or recurring units that are arranged randomly along the polymer backbone.

For reactive polymers used in this invention, the term "arranged randomly" means that blocks of recurring units are not intentionally incorporated into the reactive polymers, but that recurring units are incorporated into the backbone in a random fashion using known polymerization procedures that do not encourage the formation of block copolymers.

Recurring units in reactive polymers described herein are generally derived from the corresponding ethylenically unsaturated polymerizable monomers used in a polymerization process, which ethylenically unsaturated polymerizable monomers have the desired pendant groups. Alternatively, pendant groups can be formed or modified within recurring units after polymerization of ethylenically unsaturated polymerizable monomers having requisite precursor pendant groups.

The term "reactive polymer" is used herein to refer to the copolymers as described herein that comprise at least, but not exclusively, -A- and -B- recurring units as defined below.

The term "aqueous-base" refers to solutions, baths, or dispersions in which the predominant solvent, or at least 50 weight % of the solvents, is water.

Unless otherwise indicated, the term "mol %" when used in reference to recurring units in reactive polymers, refers to either the nominal (theoretical) amount of a recurring unit based on the amount of ethylenically unsaturated polymerizable monomer used in the polymerization process, or to the actual amount of recurring unit in the resulting reactive polymer.

Reactive Polymers

In general, the reactive polymers useful in the practice of this invention two essential features: (1) they have labile groups that upon exposure to suitable radiation are deblocked and provide pendant sulfonic acid groups, and (2) upon such irradiation, they are capable of being crosslinked only in exposed regions. While the reactive polymers can be supplied as solutions in appropriate solvents, they are best used when applied to a substrate that can be a large or small surface, including the outer surfaces of inorganic or organic particles and then dried.

The reactive polymers are generally vinyl (addition polymerized) polymers with the requisite pendant groups connected to the polymer backbone. The useful reactive polymers are vinyl polymers derived from one or more ethylenically unsaturated polymerizable monomers using solution or emulsion polymerization techniques and conditions, initiators, surfactants, catalysts, and solvents, all of which would be readily apparent to one skilled in the art from the teaching provided herein.

The useful reactive polymers generally comprise at least some recurring units that comprise pendant groups attached to the polymer backbone, which pendant groups comprise a labile sulfonic acid. The term "labile" means that the labile sulfonic acid groups can provide pendant sulfonic acid groups (such as aromatic sulfonic acid groups) upon de-blocking when the reactive polymer is exposed to radiation having a $\lambda_{max}$ of at least 150 nm and up to and including 450 nm, or more likely exposed to radiation having a $\lambda_{max}$ of at least 150 nm and up to and including 330 nm (sometimes known as "short UV"). Prior to the noted irradiation, the labile sulfonic acid groups are considered "blocked" and are not available for reaction or causing reaction.

The reactive polymers can become de-blocked and crosslinked during the noted irradiation and generation of the pendant sulfonic acid groups. In many embodiments, such crosslinking can be provided with distinct pendant acid-crosslinkable groups that are incorporated randomly along the reactive polymer backbone.

Once suitable pendant sulfonic acid groups are generated upon irradiation, the resulting polymer can be either water-soluble or water-insoluble in irradiated or exposed regions of the polymeric layer and depending upon the extent of crosslinking in the resulting polymeric layer.

Particularly useful reactive polymers used in the present invention can be represented by the following -A-, -B-, and optional -C- recurring units in random order along the polymer backbone.

In particular, the -A- recurring units are derived from any ethylenically unsaturated polymerizable monomer having appropriate pendant aromatic groups that are capable of providing pendant aromatic sulfonic acid groups from aromatic sulfonic acid oxime ester groups having a cleavable —S(=O)$_2$—O—N=C< moiety (for example a "blocking groups"). The sulfur atom of this moiety is typically connected to a carbocyclic aromatic group that is in turn attached to the polymer backbone, and the nitrogen atom of the moiety can have linear or branch substituents.

The -B- recurring units can be derived from any ethylenically unsaturated polymerizable monomer that has pendant groups that can provide sulfonic acid-catalyzed crosslinking in the irradiated polymer. Such pendant groups are well known in the art and some useful examples are described below.

More particularly, the -A-, -B-, and -C- recurring units can be represented as follows:

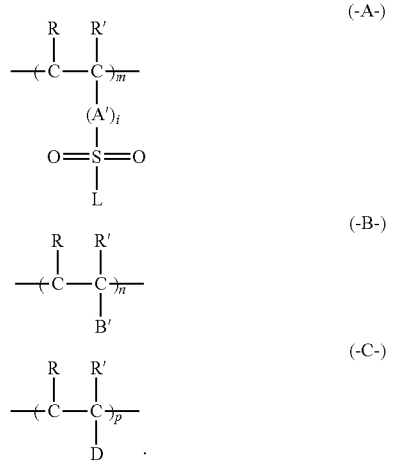

In these formulae, the -A- recurring units comprise blocked (labile) pendant aromatic sulfonic acid oxime ester groups that are capable of providing pendant aromatic sulfonic acid groups upon irradiation from exposing radiation having a $\lambda_{max}$ (maximum wavelength) of at least 150 nm and up to and including 450 nm (or a $\lambda_{max}$ of at least 150 nm and up to and including 250 nm).

Within the -A- recurring units, the moiety identified as A' can represent a single bond (wherein "i" is 0) but A' is most likely a divalent linking group (wherein "i" is 1) such as a substituted or unsubstituted arylene group including but not limited to a substituted or unsubstituted phenylene or naphthalene group. Possible substituents on the arylene group include but are not limited to alkyl groups having 1 to 3 carbon atoms and any other group that would be readily apparent to a skilled worker in the art to not interfere with removal of the L blocking group and such groups can be in any suitable position on the arylene ring. Particularly useful A' groups are substituted or unsubstituted phenylene, and unsubstituted phenylene is most useful.

Moreover, "L" is a blocking group that is readily removed during irradiation of the polymer as noted above such as an oxime ester group containing a —S(=O)—O—N=C<oxime ester moiety. This moiety is readily cleaved at the O—N bond as this bond is relatively weak in the range of 40 to 60 kcal of energy to provide pendant aromatic sulfonic acid groups in the resulting reacted and crosslinked polymer. The carbon atom in the noted oxime ester moiety can be attached to the same or different substituted or unsubstituted hydrocarbon group including but not limited to, substituted or unsubstituted alkyl (linear, branched, or cyclic) and substituted or unsubstituted aryl groups, or the carbon atom can be part of a saturated or unsaturated carbocyclic ring (including fused ring systems).

Once the blocking group has been removed from the -A- recurring units during irradiation, the -A- recurring units become "reacted -A- recurring units".

In some embodiments, the reactive polymers can comprise greater than 50 mol % -A- recurring units derived from one or more ethylenically unsaturated polymerizable monomers, which recurring units can be represented by the following Structure D':

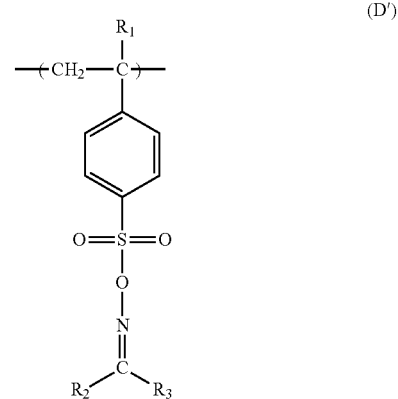

wherein $R_1$ represents hydrogen or an alkyl group having 1 to 3 carbon atoms, and $R_2$ and $R_3$ can be the same or different and represent hydrogen, a substituted or unsubstituted alkyl group (branched or linear and including cycloalkyl groups) having 1 to 10 carbon atoms, a substituted or unsubstituted aryl group having 6 or 10 carbon atoms in the aromatic ring, or a substituted or unsubstituted alkenyl group (branched or linear, and including cycloalkenyl groups) having 2 to 10 carbon atoms.

Alternatively, $R_2$ and $R_3$ together with the carbon atom to which they are attached can form a substituted or unsubstituted non-aromatic carbocyclic ring 5 to 14 carbon atoms in the cyclic ring (including fused rings), which cyclic ring can also have some carbon-carbon unsaturation but not to the extent to give the cyclic ring aromaticity. Such cyclic rings can be substituted, where valences allow, with one or more oxo (=O) groups, or with alkyl groups having 1 to 3 carbon atoms.

After irradiation, the pendant aromatic sulfonic acid groups can be neutralized using suitable cations such as alkali metal cations (for example sodium and potassium) or ammonium cations (for example, ammonium and pyridinium). It is particularly desirable in the practice of the present invention to design the reactive polymers so that upon suitable irradiation as described herein (for example, irradiation of at least 150 nm and up to and including 450 nm), the resulting de-blocked and crosslinked polymers can exhibit an ion exchange capacity of at least 20% (and particularly at least 40%) of the potential (theoretical) ion exchange capacity of a similarly irradiated (same conditions, exposure, radiation energy) homopolymer having only the same -A- recurring units. The theoretical ion exchange capacity of a given homopolymer can be calculated as the concentration of acid (mmol) per gram of homopolymer.

Particularly useful -A- recurring units comprise a cyclic oxime ester group and can be derived for example, from 1,2,3,4-tetrahydro-1,-naphthylideneamino-p-styrenesulfonate (sometimes known in the art as "TOSS" ethylenically unsaturated polymerizable monomer).

Representative useful -A- recurring units for reactive polymers are shown as follows (the first structure showing recurring units derived from TOSS), which -A- recurring units can be derived from the corresponding ethylenically unsaturated polymerizable monomers:

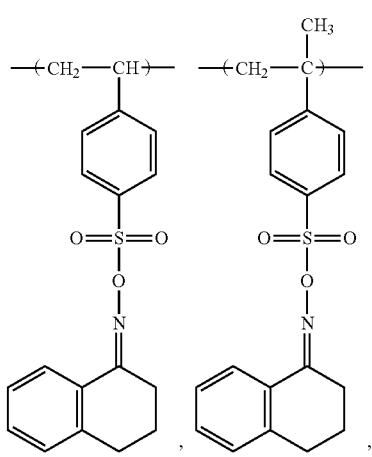

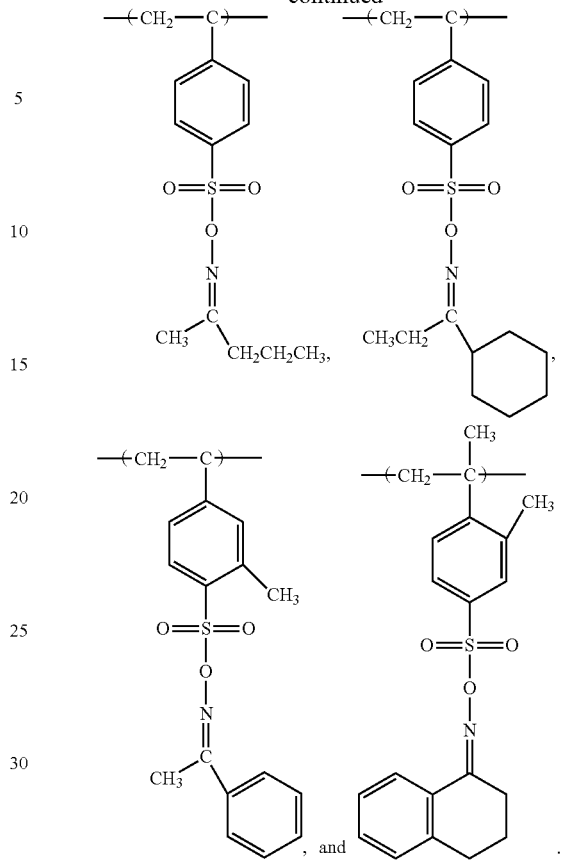

The -B- recurring units can be derived from any suitable ethylenically unsaturated polymerizable monomer, or group of monomers, having the same or different B' group that is capable of providing acid-catalyzed crosslinking when the pendant aromatic sulfonic acid groups are generated in the -A- recurring units during irradiation. For example, the -B- recurring units can comprise pendant B' groups that comprise an epoxy (such as a glycidyl group) or epithiopropyl group. Particularly useful -B- recurring units comprise pendant crosslinkable epoxy groups such as glycidyl groups and can be derived from glycidyl methacrylate or glycidyl acrylate. Other useful ethylenically unsaturated polymerizable monomers that have sulfonic acid-catalyzed crosslinking groups would be readily apparent to one skilled in the art.

Upon irradiation, the -B- recurring units can provide the crosslinking as described above, and are then considered as "reacted -B- recurring units".

In addition to the -A- and -B- recurring units described above that are essential in the reactive polymers of this invention, the reactive polymers can further comprise one or more additional recurring units that are different from all -A- and -B- recurring units, and herein identified as -C- recurring units in an amount of at least 5 mol % and up to and including 25 mol % based on the total copolymer recurring units. A skilled polymer chemist would understand how to choose such additional recurring units, and for example, they can be derived from one or more ethylenically unsaturated polymerizable monomers selected from the group consisting of alkyl acrylates, alkyl methacrylates, (meth)acrylamides, styrene and styrene derivatives, vinyl ethers, vinyl imides, and other materials that a skilled worker in the art would understand could provide desirable properties to the reactive polymer.

Thus, the D groups in the C recurring units can be for example, substituted or unsubstituted alkyl groups, substituted or unsubstituted aryl groups (such as substituted or unsubstituted phenyl groups), alkyl ester groups, aryl ester groups, or ether groups. In many useful C recurring units, the D groups are alkyl carboxyl ester groups wherein the alkyl moiety has 1 to 6 carbon atoms and is linear, branched, or cyclic in form.

In all of the -A-, -B-, and -C- recurring units, R and R' can be the same or different hydrogen, methyl, ethyl, or chloro groups and each type of recurring unit can have the same or different R and R' groups along the polymer backbone. In most embodiments, R and R' are hydrogen or methyl, and R and R' can be the same or different for the various -A-, -B-, and -C- recurring units in a given reactive polymer.

In the -A-, -B-, and -C- recurring unit formulae shown above, "m", "n", and "p" are used to represent the respective molar amounts of recurring units, based on total recurring units, in a given reactive polymer, so that the sum of m, n, and p equal 100 mol % in a given reactive polymer.

In general for the reactive polymers useful in this invention, in the -A- structure shown above, "m" represents the amount of -A- recurring units of up to and including 98 mol % based on total recurring units in the reactive polymer. Typically, "m" is at least 20 mol %, or greater than 50 mot %, or even at least 60 mol % and up to and including 98 mol %, or at least 60 mol % and up to and including 90 mol %, based on the total recurring units in the reactive polymer.

In addition, in the -B- structure shown above, "n" represents -B- recurring units in an amount of at least 2 mol %, or more typically at least 5 mol % and up to and including 50 mol %, or even at least 5 mol % and up to and including 40 mol %, based on the total recurring units in the reactive polymer.

Moreover, in the -C- structure shown above, while "p" represents -C- recurring units that can be absent (0 mol %), "p" can be up to and including 50 mol %, or typically at least 3 mol % and up to and including 25 mol %, or at least 5 mol % and up to and including 20 mol %, based on the total recurring units in the reactive polymer.

These mol % amounts of the various recurring units defined herein for the reactive polymers used in this invention are meant to refer to the actual molar amounts present in the reactive polymers. It is understood by one skilled in the art that the actual mol % values may differ from those theoretically possible (nominal) based on the amount of ethylenically unsaturated polymerizable monomers that are used in the polymerization procedure. However, under most polymerization conditions that allow high polymer yield and optimal reaction of all monomers, the actual mol % of each monomer is generally within +15 mol % of the theoretical (nominal) amounts.

Some representative reactive polymer embodiments include but are not limited to, the following copolymers and terpolymers (TOSS is identified above and FLOSS is identified below) wherein the molar ratios are theoretical (nominal) amounts based on the actual molar ratio of recurring units derived from the corresponding monomers used in the polymerization process. The actual molar amounts of recurring units can differ from the theoretical (nominal) amounts of monomers if the polymerization reactions are not carried out to completion.

The "FLOSS" monomer having the following recurring unit structure can be prepared similarly to the TOSS monomer using the synthesis described by Shirai et al. *Reactive & Functional Polymers*, 37 (1998), pp. 147-154:

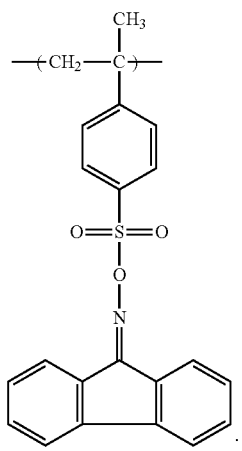

poly(TOSS-co-glycidyl methacrylate) (90:10);
poly(TOSS-co-glycidyl methacrylate) (80:20);
poly(FLOSS-co-glycidyl methacrylate) (80:20);
poly(TOSS-co-glycidyl methacrylate) (60:40);
poly(TOSS-co-glycidyl methacrylate-co-n-butyl acrylate) (80:10:10);
poly(TOSS-co-glycidyl methacrylate-co-n-butyl methacrylate) (80:10:10);
poly(TOSS-co-2-phenoxyethyl acrylate) (80:20);
poly(TOSS-co-glycidyl methacrylate) (80:20);
poly(TOSS-co-glycidyl methacrylate) (50:50);
poly(TOSS-co-glycidyl acrylate) (20:80);
poly(TOSS-co-glycidyl methacrylate) (30:70);
poly(TOSS-co-glycidyl methacrylate-co-n-butyl acrylate) (30:50:20);
poly(FLOSS-co-TOSS-glycidyl methacrylate-co-n-butyl acrylate) (10:10:60:20);
poly(TOSS-co-glycidyl methacrylate-co-n-butyl acrylate) (70:20:10);
poly(TOSS-co-glycidyl methacrylate-co-2-phenoxyethyl acrylate) (70:20:10); and
poly(FLOSS-co-glycidyl methacrylate-co-2-phenoxyethyl acrylate) (60:35:5).

The reactive polymers generally have a molecular weight ($M_w$) of at least 30,000 and up to and including 300,000 as measured by gel permeation chromatography (GPC) or by size exclusion chromatography (SEC).

The reactive polymers can be prepared using known free radical solution polymerization techniques using known starting materials, free radical initiators, and reaction conditions in suitable organic solvents such as tetrahydrofuran that can be adapted from known polymer chemistry. Where starting materials (such as ethylenically unsaturated polymerizable monomers) are not available commercially, such starting materials can be synthesized using known procedures.

Representative preparations of particularly useful reactive polymers are provided below for the Invention Examples.

In general, the prepared reactive polymers can be stored in solution in suitable solvents. Depending upon the sensitivity of the reactive polymer to light (such as room light), during and after preparation, the reactive polymers can be kept in the dark or away from light exposure until they are formulated into reactive compositions and used for various purposes. To enhance storage stability, one or more acid scavengers, such as hindered amines, can be added to the reactive polymer solution during or after polymerization. A skilled polymer chemist would know what compounds would be suitable as acid scavengers and how much to use with a particular reactive polymer and desired storage stability.

Reactive Compositions:

The reactive polymers described herein can be used in reactive compositions in various methods for forming conductive patterns as described below. Moreover, the reactive polymers can also be used for surface patterning including hydrophobic and hydrophilic regions based on whether the reactive polymers are crosslinked (hydrophobic) or not (hydrophilic), which patterning can also be accomplished using polycationic dyes and surface-charged organic or inorganic particles.

Each of the reactive compositions comprises one or more reactive polymers of this invention as the only essential component. While various optional components can be included as described below, only the essential reactive polymer is needed for providing desired patterns in the reactive composition.

One or more reactive polymers as described above are generally present in the reactive composition (and in the resulting dry polymeric layer) in an amount of at least 50 weight % and up to and including 100 weight %, or typically at least 80 weight % and up to and including 95 weight %, based on the total solids in the reactive composition (or dry polymeric layer weight).

Individual compounds that provide an acid during the noted exposure to radiation are not needed in the reactive composition and should be excluded. In addition, separate crosslinking agents or crosslinking agent precursors are excluded from the reactive compositions because the reactive polymer itself includes pendant groups that provide the crosslinking upon irradiation.

While not essential, it is sometimes desirable that the reactive composition further includes one or more photosensitizers that enhance the sensitivity of the reactive polymer to longer wavelengths (for example, greater than 300 nm). A variety of photosensitizers are known in the art such as aromatic tertiary amines, aromatic tertiary diamines, and certain aromatic polycyclic compounds such as substituted or unsubstituted anthracene compounds, as described for example in U.S. Pat. No. 4,069,054 (Smith) and U.S. Pat. No. 7,537,452 (Dede et al.). Particularly useful photosensitizers include unsubstituted anthracene and substituted anthracenes such as 9,10-diethoxyanthracene and 24-butyl-9,10-diethoxyanthracene.

One or more photosensitizers can be optionally present in the reactive composition (and dry polymeric layer) in an amount of at least 1 weight % and up to and including 30 weight %, or more likely at least 5 weight % and up to and including 15 weight %, based on the total solids in the reactive composition (or dry polymeric layer weight).

The reactive compositions can optionally include one or more addenda such as film-forming compounds, surfactants, plasticizers, filter dyes, viscosity modifiers, high boiling solvents that are compatible with the reactive polymers (such as phthalated esters including dibutyl phthalate and dioctyl phthalate), and any other optional components that would be readily apparent to one skilled in the art, and such addenda can be present in amounts that would also be readily apparent to one skilled in the art.

The essential reactive polymer and any optional compounds described above are generally dissolved in a suitable organic solvent (or mixture of organic solvents) to form a reactive composition that can be applied to a suitable substrate (described below). Useful organic solvents include but are not limited to, ketones such as 2-butanone, cyclopentanone, and cyclohexanone, substituted benzenes such as chlorobenzene and anisole, ethyl lactate, propylene glycol methyl ether acetate, dichloromethane, and γ-butyrolactone. Various mixtures of these organic solvents can be used if desired especially to dilute more toxic organic solvents with less toxic organic solvents such as blends of cyclopentanone with one or more of ethyl lactate, propylene glycol methyl ether acetate, and γ-butyrolactone.

Articles

The reactive composition described above can be applied to a suitable substrate using any suitable method including but not limited to, spin coating, bead coating, blade coating, curtain coating, or spray coating, from a suitable reservoir. Useful substrates can be chosen for a particular use or method as long as the substrate material will not be degraded by the reactive composition or any treatments to which the resulting precursor articles are subjected. The reactive composition can be applied multiple times if desired to obtain a thicker coating (reactive layer) of the reactive composition, and dried between each coating or dried only after the last application. Solvent can be removed from the reactive composition using any suitable drying technique.

In general the final dry coating of reactive composition can have an average dry thickness of at least 10 nm and up to and including 10 mm, or at of at least 0.1 μm and up to and including 100 μm, with the particular dry thickness being chosen for a particular use of the reactive composition. The average dry thickness can be determined by measuring the dry layer thickness in at least 10 different places within a 10 cm by 10 cm square of the dry reactive layer using an electron microscope or other suitable diagnostic device. Thus, in the various articles of this invention, including precursor articles (before any treatments, operations, or steps), intermediate articles (obtained after at least one treatment, operation, or step), or final products (after all desired treatments, operations, or steps), the dry polymeric layer can have the dry thickness as described in this paragraph.

Thus, useful substrates can be composed of glass, quartz, and ceramics as well as a wide variety of flexible materials such as cellulosic papers and polyesters such as poly(ethylene terephthalate) and poly(ethylene naphthalate), polycarbonates, polyamides, poly(meth)acrylates, and polyolefins. Useful polymeric substrates can be formed by casting or extrusion methods. Laminates of various substrate materials can also be put together to form a composite substrate. Any of the substrates can be treated to improve adhesion using for example corona discharge, oxygen plasma, ozone or chemical treatments using silane compounds such as aminopropyltriethoxysilane. The substrates can be of any suitable dry thickness including but not limited to at least 10 μm and up to and including 10 mm, depending upon the intended use of the resulting articles.

Particularly useful substrates are composed of poly(ethylene terephthalate) such as biaxially oriented poly(ethylene terephthalate) (PET) films that have broad uses in the electronics market. These PET films, ranging in dry thickness of at least 50 μm and up to and including 200 μm, can also comprise, on at least one side, a polymeric primer layer (also known as a subbing layer, adhesive layer, or binder layer) that can be added prior to or after film stretching. Such polymeric primer layers can comprise poly(acrylonitrile-co-vinylidene chloride-co-acrylic acid), poly(methyl acrylate-co-vinylidene chloride-co-itaconic acid), poly(glycidyl methacrylate-co-butyl acrylate), or various water-dispersible polyesters, water-dispersible polyurethanes, or water-dispersible acrylic polymers, as well as sub-micrometer silica particles. The dry thickness of the primer layer containing the silica particles can be at least 0.1 μm and up to and including 0.5 μm.

Thus, with the application of the described reactive composition to a suitable substrate, with or without appropriate drying, the present invention can provide a precursor article comprising a substrate and having disposed thereon a polymeric layer (reactive layer) comprising a reactive polymer (as described above). The polymeric layer can cover the entire substrate or only one or more portions thereof. Thus, the reactive composition, before irradiation, can be coated in a predetermined pattern, and then the predetermined pattern of reactive composition can be irradiation to form yet another pattern of de-blocked and crosslinked polymer.

Uses of Reactive Compositions

The reactive polymers described herein can be used in reactive compositions to form surface patterns for various purposes as described above. The following discussion provides details about representative patterning methods. It is to be understood that all of these uses are considered to be examples of how the present invention can be used and are not to be considered exclusive of other potential uses.

In particular, the reactive polymers described herein can be used to provide detectable patterns using polycationic dyes or charged inorganic particles, or both.

One such method comprises providing a polymeric layer comprising a reactive composition comprising a reactive polymer of the present invention comprising the -A- and -B- recurring units and molar amounts as described above. This polymeric layer can be formed on a suitable substrate, if desired, as described above by suitable application of the reactive composition, after which the applied reactive composition is typically dried to provide a precursor article as described above.

This polymeric layer in the precursor article, usually in dry form, can be then patternwise exposed to radiation having a 7, of at least 150 nm and up to and including 450 nm or to radiation having a of at least 150 nm and up to and including 330 nm, to provide a polymeric layer comprising non-exposed regions and exposed regions comprising a de-blocked and crosslinked polymer from pendant aromatic sulfonic acid groups. This exposure can be provided with any suitable exposing source or device that provides the desired radiation including but not limited to, various arc lamps and LED sources. The particular exposing source can be chosen depending upon the absorption characteristics of the reactive composition used. The exposing radiation can be projected through lenses or a lens or mask element that can be in physical contact or in proximity with the outer surface of the polymeric layer. Exposure time can range from a fraction (0.1) of a second and up to and including 10 minutes depending upon the intensity of the radiation source and the reactive composition. Suitable masks can be obtained by known methods including but not limited to photolithographic methods, flexographic methods, or vacuum deposition of a chrome mask onto a suitable substrate such as quartz or high quality optical glass followed by photolithographic patterning.

This patternwise exposure also causes crosslinking in the presence of the pendant aromatic sulfuric acid groups because of the presence of the -B- recurring units in the polymeric layer.

Alternatively, the entire polymeric layer can be uniformly exposed to a suitable source of radiation having a $\lambda_{max}$ of at least 150 nm and up to and including 450 nm or to radiation having a $\lambda_{max}$ of at least 150 nm and up to and including 330 nm, to provide uniformly exposed polymeric layer comprising a polymer comprising pendant aromatic sulfonic acid groups. The exposed reactive polymer in the polymeric layer would also be de-blocked and crosslinked as described above.

The uniformly or partially crosslinked polymeric film can have any desired dry thickness, and be disposed on a substrate or in free standing form. For example, the de-blocked and crosslinked polymeric film can have a dry thickness of at least 10 nm or of at least 10 μm.

It is not necessary to heat or bake the polymeric layer in the reactive composition in the precursor article simultaneously with or after the exposure, as may be necessary for other types of reactive polymers.

The polymeric layer is generally hydrophilic in the exposed regions while still being hydrophobic in the non-exposed regions, or it is hydrophilic over the entire polymeric layer that is uniformly exposed.

Following the exposure as described above, the de-blocked and pendant carboxylic acid groups can be neutralized (either in a patternwise fashion in exposed regions or uniformly throughout the polymeric layer) using suitable metal or organic cations, such as alkali metal cations (for example sodium or potassium cations) or ammonium, pyridinium, or morpholinium cations, in an aqueous-based solution, and therefore generate pendant carboxylate groups (either patternwise or uniformly throughout the polymeric layer). Other useful metal or organic cations for this neutralization would be readily apparent to one skilled in the art. For example, the neutralized and reacted polymer can comprise pendant aromatic carboxylic acid alkali metal salt groups.

The concentration of metal or organic cations in an aqueous-based solution useful for neutralization is at least 0.01 molar and up to and including 20 molar with the optimal amount being readily chosen by one skilled in the art depending upon the reactive polymer, the amount of exposure, the amount of pendant carboxylic acid groups to be neutralized, and particular cations used in the method. The desired amount can be readily determined using the working examples provided below as a guide for routine experimentation.

After the neutralization procedure, both the exposed and non-exposed regions of the polymeric layer (or the entire polymeric layer) can be contacted with a polycationic colorant that ionically binds to at least some of the pendant neutralized aromatic sulfonic acid groups in the exposed regions of the polymeric layer. If there are non-exposed regions in the polymeric layer, the polycationic colorant can adsorb to reactive polymer in the non-exposed regions of the polymeric layer.

This polycationic colorant contacting can be carried out using a solution or dispersion of one or more polycationic colorants that can be either dyes or pigments. Mixture of polycationic dyes and pigments can be used if desired as long as they do not interfere with the desired use of the polycationic colorants.

Useful polycationic colorants generally have an overall molecular positive charge of at least 2 and more typically an overall molecular positive charge of at least 4. Useful polycationic colorants include but are not limited to, polycationic compounds that are selected from the group consisting of a cyanine dye, merocyanine dye, acridine dye, polymethine dye, porphyrin dye, phthalocyanine dye, triarylmethane dye, and basic dye. Some representative useful polycationic colorants are described in the Examples below.

Depending upon the particular polycationic colorant, the solvent(s) used can be aqueous-based or they can be predominantly (at least 50 weight %) composed of water with one or more water-miscible organic solvents including but not limited to, alcohols and ketones. In most embodiments, the polycationic colorant is provided in an aqueous-based solution or dispersion.

The amount of one or more polycationic colorants in the noted solutions can be at least 0.025 weight % and up to and including 5 weight %, or more typically at least 0.025 weight % and up to and including 0.25 weight %, where the optimal amount can be readily determined by a skilled worker using the direction of the working examples provided below.

After contacting the neutralized and crosslinked polymer with the polycationic colorant, the polymeric layer can be subjected to washing with an aqueous-based solution to remove primarily (or only) non-bound polycationic colorant from the exposed regions of the polymeric layer (or entire polymeric layer if it is uniformly exposed). In addition, this washing is intended to remove non-adsorbed polycationic colorant from any non-exposed regions of the polymeric layer.

Suitable aqueous-based solutions for this washing include but are not limited to distilled, deionized, or tap water, or any other aqueous-based solution that accomplishes the desired result. In many embodiments, this washing is carried out at a pressure of at least 5 psi and up to and including 20 psi or more likely at least 5 psi and up to and including 10 psi.

Thus, this method can be used with the precursor article described above, and can then be used to provide an intermediate article comprising a substrate and having disposed thereon a polymeric layer comprising exposed regions and non-exposed regions, the exposed regions of the polymeric layer comprising a de-blocked and crosslinked copolymer comprising neutralized pendant aromatic sulfonic acid groups to which a polycationic colorant is ionically bound, the de-blocked and crosslinked polymer being derived from the reactive polymer described herein, and the non-exposed regions comprising a reactive polymer described herein comprising the -A- and -B- recurring units and molar amounts described above, and the non-exposed regions also having the polycationic colorant adsorbed thereto.

The washed polymeric layer can be used in various embodiments to achieve desired patterns.

For example, in some embodiments, after the washing, the method of this invention can further comprise:

contacting the polymeric layer with negatively-charged colloidal particles that adhere to the non-exposed regions of the polymeric layer having adsorbed polycationic colorant, the non-exposed regions comprising a reactive polymer as described herein.

Useful negative-charged colloidal particles useful in this procedure can have an average diameter of at least 0.2 μm and up to and including 8 μm, or typically an average diameter of at least 0.5 μm and up to and including 2 μm. "Average diameter" can be determined using known procedures and equipment, for example using a Horiba LA-920 apparatus as described below in the working examples.

Useful negatively-charged colloidal particles can include but are not limited to, negatively-charged silica particles (or other negatively-charged inorganic particles) or organic polymeric particles having negatively-charged surface groups on the outer surface of each particle.

For example, some useful negatively-charged colloidal particles are polystyrene particles, poly(meth)acrylate particles, polyamide particles, polyimide polymers, polycarbonate particles, polyurethane particles, or polyester particles, all of which particles have negatively-charged surface groups (such as carboxylate, sulfate, phosphonate, and phosphate surface groups) that can be incorporated into such particles using known procedures in polymeric chemistry.

Useful commercial products of this type negatively-charged silica particles having surface sulfate groups, sulfate-surface charged or carboxylate-surface charged polymeric latex particles (2 μm) are available from Invitrogen Molecular Probes.

This contact with the negatively-charged colloidal particles can be achieved by immersing the polymeric layer containing the polycationic colorant in a dispersion of such colloidal particles for any suitable time generally greater than 5 minutes at any suitable temperature including room temperature and up to any elevated temperature that does not harm the polymeric layer or any other chemicals used in the method.

Useful amounts of negatively-charged colloidal particles for the practice of these embodiments would be readily apparent to one skilled in the art using routine experimentation to determine the optimal particles that can be used for patterning according to the present invention in view of the particular and amount of neutralized pendant aromatic sulfonic acid groups and the amount of polycationic colorant that are present in the crosslinked polymeric layer.

After this contact with the negatively-charged colloidal particles, the polymeric layer can be washed again using the same or different aqueous-based solution as described above, and using the same or different washing conditions. This washing is intended to remove non-adhering negatively-charged colloidal particles from the exposed regions of the polymeric layer. It would be apparent to one skilled in the art that the smaller colloidal particles are harder to wash off and thus would require higher washing pressure for this purpose.

The noted embodiments using the reactive polymers of this invention thus be used to provide an article comprising a substrate and having disposed thereon a polymeric layer comprising exposed and non-exposed regions, the exposed regions of the polymeric layer comprising a de-blocked and crosslinked copolymer comprising neutralized pendant aromatic sulfonic acid groups to which a polycationic colorant is ionically bound, which de-blocked and crosslinked copolymer is derived from the reactive polymer described herein, and the non-exposed regions of the polymeric layer comprising the reactive polymer described herein comprising -A- and -B- recurring units and molar amounts as described above, and the non-exposed regions of the polymeric layer further comprising negatively-charged colloidal particles and adsorbed polycationic colorant.

In alternative embodiments of this invention, after the polymeric layer having polycationic colorant adsorbed in the exposed regions is washed as described above, the polymeric layer can be contacted with positively-charged colloidal particles that adhere to the exposed regions of the polymeric layer containing de-blocked and crosslinked polymer derived from the reactive polymer described herein.

Useful positively-charged colloidal particles useful in this procedure can have an average diameter of at least 0.2 μm and up to and including 8 μm, or typically an average diameter of at least 0.5 μm and up to and including 2 μm. "Average diameter" can be determined using equipment and procedures described above for measuring the negatively-charged colloidal particles.

Useful positively-charged colloidal particles can include but are not limited to, positively-charged non-metallic organic polymeric particles having positively-charged surface groups, or inorganic particles having positively-charged surface groups.

Some useful positively-charged colloidal particles are metal ions including but not limited to, silver ions, copper ions, platinum ions, nickel ions, palladium ions, iron ions, and tin ions. Such positively-charged metallic ions can be provided as metal salts or metal-ligand complexes (having an overall positive charge). For example, useful materials of this type include but not limited to, metal salts and metal-ligand complexes of nitrates, halides, acetates, cyanides, thiocyanates, amines, nitriles, and sulfates. Positively-charged organic polymeric colloidal particles are also useful if they have appropriate surface changes for example derived from various amine or amidine surface-functionalized polymeric latex particles. Positively-charged silica particles are also used and obtainable from commercial sources.

This contact with the positively-charged colloidal particles can be achieved by immersing the polymeric layer containing the polycationic colorant in a dispersion of such colloidal particles for any suitable time generally greater than 5 minutes at any suitable temperature including room temperature and up to any elevated temperature that does not harm the polymeric layer or any other chemicals used in the method.

Useful amounts of metal salt, metal-ligand complex or other positively-charged colloidal particles for the practice of these embodiments would be readily apparent to one skilled in the art using routine experimentation to determine the optimal colloidal particles that can be used for patterning according to the present invention in view of the particular and amount of neutralized pendant aromatic sulfonic acid groups and polycationic colorant that are present in the crosslinked polymeric layer.

After this contact with the positively-charged colloidal particles, the polymeric layer can be washed again using the same or different aqueous-based solution as described above, and using the same or different washing conditions. This washing is intended to remove non-adhering positively-charged colloidal particles from the non-exposed regions of the polymeric layer. As noted above, as the size of the colloidal particles decreases, more washing pressure is required.

In addition, the reactive polymer of this invention can be used to provide a different article comprising a substrate and having disposed thereon a polymeric layer comprising exposed and non-exposed regions, the exposed regions of the polymeric layer comprising a de-blocked and crosslinked copolymer comprising neutralized pendant aromatic sulfonic acid groups to which are adhered positively-charged colloidal particles, which de-blocked and crosslinked copolymer is derived from a reactive polymer described herein, and the non-exposed regions of the polymeric layer comprising the reactive polymer described herein comprising -A- and -B- recurring units and molar amounts described above, and the non-exposed regions of the polymeric layer further comprising adsorbed polycationic colorant.

Thus in some embodiments of the method of the present invention, after patternwise exposure, the polymeric layer can be subject to:

neutralizing the pendant sulfonic acid groups in the exposed regions of the polymeric layer containing a de-blocked and crosslinked polymer derived from a reactive polymer described herein, contacting both the exposed and non-exposed regions of the polymeric layer with a polycationic colorant that ionically binds to at least some of the pendant neutralized sulfonic acid groups in the exposed regions of the polymeric layer, and that adsorbs to the polymeric layer in the non-exposed regions, washing the polymeric layer with an aqueous solution to remove non-bound polycationic colorant from the exposed regions of the polymeric layer and non-adsorbed polycationic colorant from the non-exposed regions of the polymeric layer, contacting the polymeric layer with positively-charged colloidal particles that adhere to the exposed regions of the polymeric layer, and washing the polymeric layer to remove non-adhering positively-charged colloidal particles from the non-exposed regions of the polymeric layer.

The present invention provides at least the following embodiments and combinations thereof, but other combinations of features are considered to be within the present invention as a skilled artisan would appreciate from the teaching of this disclosure:

1. A method comprising:

providing a polymeric layer comprising a copolymer that comprises a backbone of at least -A- and -B- recurring units, all recurring units being arranged randomly along the backbone, wherein the -A- recurring units comprise pendant groups that are capable of providing pendant aromatic sulfonic acid groups upon irradiation with radiation having a $\lambda_{max}$ of at least 150 nm and up to and including 450 nm, the -A- recurring units being present in the copolymer in an amount of up to and including 98 mol % based on total copolymer recurring units, and the -B- recurring units comprise pendant groups that can provide crosslinking upon generation of the aromatic sulfonic acid groups in the -A- recurring units, the -B- recurring units being present in the copolymer in an amount of at least 2 mol %, based on total copolymer recurring units, and patternwise exposing the polymeric layer to radiation having a $\lambda_{max}$ of at least 150 nm and up to and including 450 nm to provide pendant sulfonic acid groups in the copolymer and to provide crosslinking in the copolymer in the exposed regions of the polymeric layer.

2. The method of embodiment 1, further comprising:

neutralizing the pendant sulfonic acid groups in the exposed regions of the polymeric layer to provide pendant neutralized sulfonic acid groups, contacting both the exposed and non-exposed regions of the polymeric layer with a polycationic colorant that ionically binds to at least some of the pendant neutralized sulfonic acid groups in the exposed regions of the polymeric layer, and that adsorbs to the polymeric layer in the non-exposed regions, and washing the polymeric layer with an aqueous solution to remove non-bound polycationic colorant from the exposed regions of the polymeric layer and non-adsorbed polycationic colorant from the non-exposed regions of the polymeric layer.

3. The method of embodiment 2, further comprising, after washing the polymeric layer:

contacting the polymeric layer with positively-charged colloidal particles that adhere to the exposed regions of the polymeric layer having adsorbed polycationic colorant, and again washing the polymeric layer to remove non-adhering positively-charged colloidal particles from the non-exposed regions of the polymeric layer.

4. The method of embodiment 2, further comprising after washing the polymeric layer:

contacting the polymeric layer with negatively-charged colloidal particles that adhere to the non-exposed regions of the polymeric layer, and again washing the polymeric layer to remove non-adhering negatively-charged colloidal particles from the exposed regions of the polymeric layer.

5. The method of any of embodiments 2 to 4, wherein the again washing is carried out at a pressure of at least 5 psi and up to and including 20 psi.

6. An intermediate article comprising a substrate and having disposed thereon a dry polymeric layer comprising exposed regions and non-exposed regions, the exposed regions of the dry polymeric layer comprising a crosslinked and neutralized copolymer comprising reacted -A- recurring units and reacted -B- recurring units, and neutralized pendant sulfonic acid groups in the reacted -A- recurring units to which a polycationic colorant is ionically bound, and the non-exposed regions of the dry polymeric layer comprising a non-crosslinked copolymer that comprises a backbone of at least -A- and -B- recurring units arranged randomly along the backbone, the -A- recurring units comprising pendant groups that are capable of providing pendant aromatic sulfonic acid groups upon irradiation at radiation having a $\lambda_{max}$ of at least 150 nm and up to and including 450 nm, the -A- recurring units being present in the copolymer in an amount of up to and including 98 mol % based on total copolymer recurring units, and the -B- recurring units comprising pendant groups that can provide crosslinking upon generation of the pendant aromatic sulfonic acid groups in the -A- recurring units, the -B- recurring units being present in an amount of at least 2 mol %, based on total copolymer recurring units, and the non-exposed regions of the dry polymeric layer also having the polycationic colorant adsorbed thereto.

7. An article comprising a substrate and having disposed thereon a dry polymeric layer comprising exposed and non-exposed regions, the exposed regions of the dry polymeric layer comprising a crosslinked and neutralized copolymer comprising reacted -A- recurring units and reacted -B- recurring units, and neutralized pendant sulfonic acid groups in the reacted -A- recurring units to which a polycationic colorant is ionically bound, and the non-exposed regions of the dry polymeric layer comprising a non-crosslinked copolymer that comprises a backbone of at least -A- and -B- recurring units arranged randomly along the backbone, the -A- recurring units comprising pendant groups that are capable of providing pendant aromatic sulfonic acid groups upon irradiation to radiation having a $\lambda_{max}$ of at least 150 nm and up to and including 450 nm, the -A- recurring units being present in the non-crosslinked copolymer in an amount of up to and including 98 mol % based on total non-crosslinked copolymer recurring units, and the -B- recurring units comprising pendant groups that can provide crosslinking upon generation of the aromatic sulfonic acid groups in the -A- recurring units, the -B- recurring units being present in the non-crosslinked copolymer in an amount of at least 2 mol %, based on total non-crosslinked copolymer recurring units, and the non-exposed regions of the dry polymeric layer further comprising negatively-charged colloidal particles and adsorbed polycationic colorant.

8. An article comprising a substrate and having disposed thereon a dry polymeric layer comprising exposed and non-exposed regions, the exposed regions of the dry polymeric layer comprising a crosslinked and neutralized copolymer comprising neutralized pendant sulfonic acid groups to which are adhered positively-charged colloidal particles, and the non-exposed regions of the dry polymeric layer comprising a non-crosslinked copolymer that comprises a backbone of at least -A- and -B- recurring units arranged randomly along the backbone, the -A- recurring units comprising pendant groups that are capable of providing pendant aromatic sulfonic acid groups upon irradiation with radiation having a $\lambda_{max}$ of at least 150 nm and up to and including 450 nm, the -A- recurring units being present in the non-crosslinked copolymer in an amount of up to and including 98 mol % based on total non-crosslinked copolymer recurring units, and the -B- recurring units comprising groups that can provide crosslinking upon generation of the aromatic sulfonic acid groups in the -A- recurring units, the -B- recurring units being present in the non-crosslinked copolymer in an amount of at least 2 mol %, based on total non-crosslinked copolymer recurring units, and the non-exposed regions of the dry polymeric layer further comprising adsorbed polycationic colorant.

9. The article of any of embodiments 6 to 8, wherein the dry polymeric layer has a dry thickness of at least 10 nm.

10. Any of the embodiments 3, 5, 8, and 9, wherein the positively-charged colloidal particles have an average diameter of at least 0.2 and up to and including 8 µm.

11. Any of the embodiments 4, 5, 7, and 9, wherein the negatively-charged colloidal particles have an average diameter of at least 0.2 µm and up to and including 8 µm.

12. Any of embodiments 1 to 11, wherein the copolymer comprises -A- recurring units that are present in an amount of at least 50 mol % and up to and including 98 mol % based on total copolymer recurring units, and -B- recurring units that are present in an amount of at least 2 mol % and up to and including 50 mol % based on total copolymer recurring units.

13. Any of embodiments 1 to 12, wherein the -B- recurring units comprise pendant crosslinkable epoxy groups.

14. Any of embodiments 1 to 13, wherein the copolymer further comprises one or more additional recurring units that are different from all -A- and -B- recurring units in an amount of at least 3 mol % and up to and including 25 mol % based on the total copolymer recurring units.

15. Any of embodiments 1 to 14, wherein upon irradiation, the reactive polymer is capable of having an ion exchange capacity of at least 20% based on the theoretical ion exchange capacity of an irradiated homopolymer having only the same -A- recurring units.

16. Any of embodiments 1 to 15, wherein the polycationic colorant is a polycationic dye that is selected from the group consisting of a cyanine dye, merocyanine dye, acridine dye, polymethine dye, porphyrin dye, phthalocyanine dye, triarylmethane dye, and basic dye.

17. Any of embodiments 3, 5, 8, 9, 10, and 12-16, wherein the positively-charged colloidal particles are metal ions.

18. Embodiment 17, wherein the positively-charged colloidal particles are silver ions, copper ions, platinum ions, nickel ions, palladium ions, iron ions, iridium ions, rhodium ions, or tin ions.

19. Any of embodiments 3, 5, 8, 9, 10, and 12-16, wherein the positively-charged colloidal particles are non-metallic organic polymeric particles having positively-charged surface groups, or inorganic particles having positively-charged surface groups.

20. Any of embodiments 4, 5, 7, 9, 10, and 12-16, wherein the negatively-charged colloidal particles are negatively-charged silica particles or organic polymeric particles having negatively-charged surface groups.

The following Examples are provided to illustrate the practice of this invention and are not meant to be limiting in any manner.

For some of the examples described below, the TOSS monomer was prepared using the following synthetic preparation:

Embodiments of inventive reactive polymers and non-inventive Comparative polymer were prepared using the following general synthetic scheme showing copolymer 4 derived from the TOSS monomer and glycidyl methacrylate (Gm) which general synthetic reaction scheme is not to be considered limiting. The reactants 1 and 2 and TOSS monomer 3 were prepared as described below.

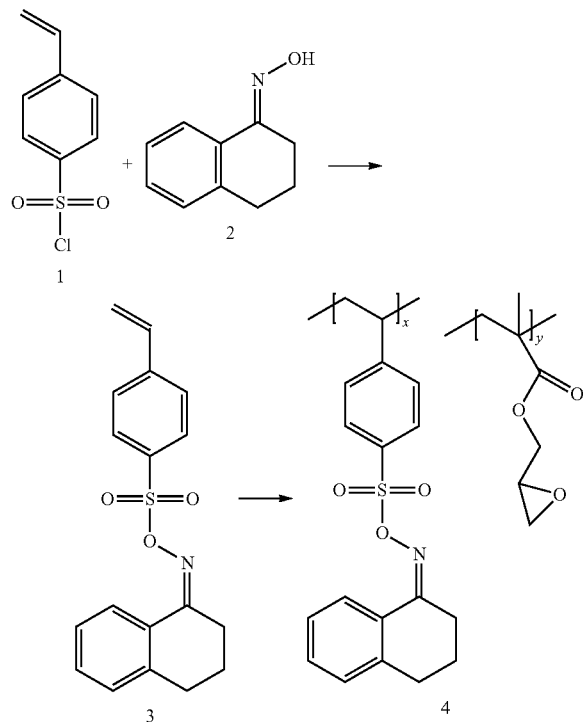

p-Styrenesulfonyl chloride 1 was prepared from sodium p-styrenesulfonate and thionyl chloride according to the method reported by Kamogawa et al. [*Bull. Chem. Soc. Jpn.,* 56, 762-765 (1983)].

α-Tetralone oxime 2 was prepared from α-tetralone according to the method reported by Zhao et al. [*Organic Lett.,* 10, 505-507 (2008)] with the following modifications:

A single neck 1 liter round bottom flask with magnetic stirring was charged with α-tetralone oxime (33.00 g, 0.226 mol), hydroxylamine hydrochloride (24.0 g, 0.345 mol), sodium acetate (31.67 g, 0.386 mol), 200 ml of water, and 200 ml of methanol and heated under nitrogen at reflux temperature for 4 hours. The mixture was allowed to cool and then placed in a freezer overnight to crystallize the reaction product. The resulting white crystals were collected, rinsed with methanol, and dried to yield 28.54 g (78%) of the desired oxime 2.

1,2,3,4-Tetrahydro-1,-naphthylideneamino p-styrenesulfonate 3 was prepared according to the method reported by M. Shirai et al. [*Macromoledules,* 25, 195-200 (1992)] with the following modifications (the prepared reaction solution and resulting TOSS monomer 3 were protected from room light as much as possible during the reaction and workup):

A single neck 250 ml amber round bottom flask with magnetic stirring was charged with α-tetralone oxime (7.95 g, 0.049 mol), pyridine (15.0 g, 0.380 mol) and cooled in an ice bath to 0° C. p-Styrenesulfonyl chloride (10.0 g, 0.049 mol) was added dropwise while keeping the reaction solution temperature below 5° C. The reaction solution was allowed to warm to room temperature and the reaction was monitored by thin layer chromatography (TLC, silica gel with 100% methylene chloride eluting solvent). When the desired reaction was complete (about 4 hours), methylene chloride (100 ml) and a 10% aqueous hydrochloric acid solution (100 ml) were added and the desired product was extracted twice using 100 ml of methylene chloride. The extracts were combined and washed with water (twice with 100 ml), dried over magnesium sulfate, and evaporated to dryness. The residue was purified by gravity column chromatography (GCC) (silica gel with 100% methylene chloride eluting solvent) to yield 11.66 g (72%) of a white solid TOSS monomer 3. Due to the instability of the TOSS monomer as a solid, it was stored as a solution in tetrahydrofuran (THF, 25% solids) in the refrigerator for up to 3 days before it was used to prepare copolymers as described below.

Preparation of Reactive Polymer Embodiments:

During preparation and use, all of the reactive polymers were protected from room light as much as possible. For the reactive polymer of Invention Example 1, having an approximate composition of 80:20 mol ratio of TOSS monomer 3 1,2,3,4-tetrahydro-1,-naphthylideneamino p-styrenesulfonate (3.00 g, 0.0092 mol) and glycidyl methacrylate (Gm, 0.33 g, 0.0023 mol), the two ethylenically unsaturated polymerizable monomers were dissolved in THF (10.0 g, 25% solids) in a 100 ml amber round bottom and purged with nitrogen for about 30 minutes. A polymerization initiator, 2,2'-azobisisobutyronitrile, was added (0.06 g, 0.0003 mol, 3 mol % of combined monomers) and the flask was sealed with a secured septum and set in a preheated oil bath at 65° C. for 10 hours (polymerizations were run between 5 and 10 hours with 8 hours being the optimum time). The reaction solution was cooled and precipitated into ethyl acetate (300 ml) and the resulting solid copolymer was collected by filtration and dried. The solid copolymer was redissolved in THF at 25% solids and precipitated into methanol (300 ml). The solid copolymer was collected by filtration and dried to yield 2.46 g (74%) that were dissolved in THF at 15% solids and 1,2,2,6,6-pentamethylpiperidine (12.3 µl, 1 mol % based on the -A- recurring units in the reactive polymer) was added to provide storage stability. The resulting solution was stored in the refrigerator for up to 4 months before use. The resulting copolymer was characterized as follows to determine that the desired copolymer was obtained.

Characterization Data by NMR:

Approximately 150 mg of a polymer was dissolved in 3 ml of $CD_2Cl_2$. TMS was added as a chemical shift reference and $Cr(acac)_3$ was added as a relaxation agent. A $^{13}C$ NMR spectrum was obtained at 125 MHz under quantitative conditions. The actual mol % of each type of recurring unit in the desired polymer was determined from integral averages from several resonances of each recurring unit.

Characterization Data by SEC:

The sample of polymer was examined using size-exclusion chromatography (SEC) at 35° C. in N,N-dimethylformamide (DMF) containing 0.01 molar lithium nitrate. The column set consisted of three 8 mm×300 mm GRAM Linear M columns from Polymer Standards Services, calibrated with narrow-molecular-weight distribution poly(methyl methacrylate) (PMMA) standards. This system has multiple detectors that measure differential refractive index, UV-Visible absorption, and viscosity of the eluent. The results were plotted as the normalized differential logarithmic molecular weight distribution where the ordinate "$W_a$ (log M)" is the weight fraction of polymer per log M increment. The number-average ($M_a$), weight-average ($M_w$), z-average ($M_x$) molecular weights and intrinsic viscosity in units of dl/g in DMF at 35.0° C. (if applicable) are determined. The long-term 3σ coefficient of variation for $M_w$ of a broad PMMA standard was ±5%. Only $M_w$ values are shown below in TABLE I.

Inventive reactive polymers I-2 through I-10 and non-inventive polymers C-1 to C-5 were prepared in the same manner with varying molar ratios of the ethylenically unsaturated polymerizable monomers as shown below in TABLE I. These polymers were characterized for actual recurring unit mol % and molecular weight in the same manner.

The following TABLE I has a summary the various polymers inside and outside of the present invention that were prepared using the general synthetic method described for Invention Example 1. The -C- Monomer and -C- Recurring Unit refer to the specific additional ethylenically unsaturated polymerizable monomers used to prepare the reactive polymers as identified in TABLE I. The TOSS recurring unit is a representative example of the "-A-" recurring units and Gm is a representative example of the "-B-" recurring units as noted above for the definition of the reactive polymers of the present invention.

beaker containing the Milli-Q water was emptied and refilled and this washing process was repeated twice. The washed glass plates were then stored in water until further use as substrates, at which time they were dried in an oven at 95° C.

Preparation of Adhesion Promoting Coating:

A 1% solution of aminopropyltriethoxysilane (APTES) in Milli-Q water was prepared (10 g of APTES in 990 g of Milli-Q water) and stirred for 20 minutes. A portion (500 ml) of this solution was poured into each of two 600 ml Nalgene beakers. Three of the glass plates described above were placed in each beaker, leaning them on the sides of the beaker without overlapping them, and left for 30 minutes. The glass plates were then removed, rinsed 3 times with Milli-Q water, and baked for 1 hour at 95° C. Each glass plate was then rinsed for one minute each in the following solvent sequence: acetone, Milli-Q water, acetone, tetrahydrofuran, and lastly

TABLE I

| Polymer | TOSS Monomer (nominal mol %) | TOSS Recurring Unit (actual mol %)$^a$ | Gm Monomer (nominal mol %) | Gm Recurring Unit$^b$ (actual mol %)$^a$ | -C- Monomer (nominal mol %) | -C- Recurring Unit (mol %)$^a$ | Polymer $M_w$ |
|---|---|---|---|---|---|---|---|
| I-1 | 80 | 86 | 20 | 14 | 0 | 0 | 39,900 |
| I-2 | 60 | 69 | 40 | 31 | 0 | 0 | 47,300 |
| I-3 | 80 | 85 | 20 | 15 | 0 | 0 | 96,300 |
| C-1 | 100 | 100 | 0 | 0 | 0 | 0 | 108,000 |
| I-4 | 80 | 84 | 20 | 16 | 0 | 0 | 126,000 |
| I-5 | 80 | 83 | 20 | 17 | 0 | 0 | 82,900 |
| C-2 | 20 | 24 | 80 | 76 | 0 | 0 | 45,600 |
| I-6 | 50 | 55 | 50 | 45 | 0 | 0 | 49,700 |
| I-7 | 80 | 87 | 10 | 9.4 | 10 | n-butyl acrylate 3.5 | 292,000 |
| I-8 | 80 | 83 | 10 | 7.7 | 10 | n-butyl methacrylate 8.8 | 277,000 |
| C-3 | 80 | 89 | 0 | 0 | 20 | 2-phenoxyethyl acrylate 11 | 64,700 |
| C-4 | 80 | 90.8 | 0 | 0 | 20 | n-butyl acrylate 9.2 | 73,400 |
| I-9 | 80 | 85 | 10 | 11 | 10 | n-butyl acrylate 3.8 | 223,000 |
| I-10 | 70 | 77 | 20 | 19 | 10 | n-butyl acrylate 4 | 109,000 |
| I-11 | 70 | 79 | 20 | 16 | 10 | 2-phenoxyethyl acrylate 4.5 | 101,000 |
| I-12 | 90 | 90 | 10 | 10 | 0 | 0 | 278,000 |

$^a$mol % determined by NMR
$^b$Derived from glycidyl methacrylate

Some of the reactive polymers described above were used in various patterning methods according to the present invention. Precursor articles comprising an inventive reactive polymer composition (or a Comparative polymer composition) on a substrate were prepared using the following procedures.

Preparation of Quartz Plates with "Piranha" Solution:

Reagent grade sulfuric acid (350 ml) was poured into a clean dry 600 ml Pyrex beaker followed by the slow addition of 150 ml of a 30% hydrogen peroxide ($H_2O_2$) solution. Glass plates were placed into a Teflon holder and lowered into the resulting "Piranha" solution until they were completely submerged. The glass plates were left in the "piranha" solution for 1 hour, and they were then transferred to a Pyrex beaker containing 500 ml of Milli-Q water where the glass plates and holder were dunked up and down for 1 minute. The Pyrex acetone. The treated glass plates were then ready for use or they could be stored for 2 hours in Milli-Q water.

Preparation of Reactive Polymer Solutions:

Solutions (1 weight %) of the reactive polymers of this invention and Comparative polymers were prepared by dissolving the particular polymer initially in tetrahydrofuran (THF) to give a 15 weight % solution and then diluting with THF to 1 weight %. The data shown in TABLE III below was generated using reactive polymer solutions prepared in the same manner except that the reactive polymers or Comparative polymers were present at 6 weight %.

Spin coating of Reactive Polymer Solutions:

A spin-coater was set to coat at 2500 RPM for 30 seconds. An APTES-coated glass plate described above was removed from water, dried using nitrogen. A coating solution (0.5 ml)

of each reactive polymer (or Comparative polymer) was spin coated to provide a dried polymer coating on the glass plate substrate to form precursor articles.

Determination of Ion Exchange Capacity:

This parameter was determined for many of the reactive polymers of this invention as well as some of the Comparative polymers, as follows:

A 0.0036 molar sodium bicarbonate solution was prepared and thoroughly mixed to be used as a titration medium. A 0.02 normal solution of hydrochloric acid was also prepared for use as a titrant. A polymer-coated quartz slide (a precursor article as described above) was placed in a glass Petri dish with the polymer-coated side facing upward and 25 ml of the titration medium was then added to the Petri dish. A flat surface combination pH electrode was used, and titration was carried out using the titrant at 30 seconds between each titrant addition to allow equilibration. The titration medium was stirred for 2 minutes prior to initiating titration with the hydrochloric acid titrant, and the equivalence point for each titration was evaluated using a conventional Gran's plot technique. Replicate experiments were carried out to obtain the average mmol/g of polymer results shown in the last column.

The results of these evaluations are provided in TABLE III below for the several Inventive reactive polymers and Comparative polymers.

Exposure of Precursor Articles:

The polymer coating in each precursor article was then uniformly (not patternwise) exposed using an Oriel 6292 200 Watt Mercury(Xenon) Ozone Free lamp (Newport Corporation). Between the lamp and the precursor article, at 5 cm distance from the lamp, was interposed a 400 nm OD 2 shortpass 50 mm diameter filter (Edmund Optics). Unless otherwise noted, each exposure was for sixty seconds with the precursor article (and polymer coating) arranged at a 28.5 cm distance from the lamp. This exposure provided a de-blocked and crosslinked polymer having pendant aromatic sulfonic acid groups in the precursor articles prepared using the inventive reactive polymer described herein. The exposed Comparative polymers were either not crosslinked or insufficiently crosslinked.

Neutralization of Exposed Polymer:

Samples of exposed articles containing an exposed polymeric layer were placed in a 0.5% sodium bicarbonate bath for forty seconds to neutralize pendant sulfonic acid groups that were present in the polymeric layer.

Dye Treatment of Exposed and Neutralized Polymer:

Following neutralization, samples of exposed articles were dipped in a 0.1 weight % dye solution (dyes described below) in water for ten minutes, rinsed under a stream of deionized water, and then dried with nitrogen. Where dye solubility did not reach 0.1 weight % in the water, the immersion time in the dye solution was extended to four hours. The result was articles having dye absorbed to part or all neutralized polymeric layer.

Particle Deposition on Dye Treated Articles:

A 1 weight % aqueous suspension of the surface-charged silica particles (described below in TABLES V and VI) at pH 7 was placed on each of the imagewise exposed and neutralized polymer surfaces for ten minutes to allow the silica particles to settle onto the polymer surfaces. While still wet, each article was affixed to a holder such that the polymer surface was at a 45 degree angle to vertical and immediately rinsed using a vertical deionized water stream from a pressure vessel at a pressure of at least 5 psi.

Negative Silica Particles:

Angstrom Sphere Silica Microspheres were purchased from Fiber Optic Center Inc. New Bedford, Mass. A 1% aqueous dispersion of the nominal 1 μm silica particle was prepared by weighing 0.2 g of silica in a scintillation vial equipped with stir bar. Milli-Q water was added dropwise while constantly stirring until all particles were wet. The requisite amount of water was added and the pH was adjusted to 7. The mean particle size was 0.91 μm and the zeta potential at pH 7 was −47 mV.

Positive Silica Particles:

Alfa Aesar silicon dioxide powder (10.0 g) was dispersed in isopropanol (190.0 g) to make a 5% dispersion by sonicating with a probe for ten minutes and then quickly placing it into a 4-neck 1-liter flask with an overhead stirrer and condenser. To the stirred dispersion was then added dimethylaminopropyl trimethoxysilane (d=0.978; 1.0 ml) followed by heating to 60° C. overnight in an oil bath. The reaction was allowed to cool over two hours. Excess 0.5 ml of iodomethane was then added to the solution followed by stirred at room temperature for two days. After filtration using a 4-8 μm porosity filter funnel, the filtrate was rinsed well with isopropyl alcohol. The treated particles were dried to afford 10.44 g of white particles. A 1 weight % dispersion of the particles was prepared with the requisite amount of water, and following a final sonication, the pH was adjusted to pH 6. The mean particle size was 1.47 μm and the zeta potential at pH 6 was +49 mV.

Particle Size and Zeta Potential:

Particle size distributions were obtained using a Horiba LA-920 (Horiba Instruments Inc.) and a static light technique that produces a volume weighted distribution. Samples were analyzed while diluted in Ultrapure $H_2O$. Zeta potential was measured using the "Malvern Zetasizer Nano-ZS" (ZEN) from Malvern Instruments Ltd. Measured samples were diluted at the appropriate pH to a concentration level suitable for analysis.

Image Analysis:

Pattern areas and particle counts were determined from Tiff images of the samples obtained using an Olympus BX60 microscope, equipped with a Diagnostic, Inc. camera. The images were analyzed using ImageJ, a public domain, Java based image processing program developed at the National Institutes of Health, which program was downloaded from the nih.gov website. Version ImageJ 1.47p was used and the "analyze particles" function in ImageJ was utilized.

TABLE II

| Sample | Article | Polymer | Step | Abs × $10^3$ [at 228 nm] | Abs × $10^3$ [at 260 nm] | % Retained Non-exposed [at 260 nm] After Neutralization | % Conversion [at 260 nm] After Exposure | % Retained [at 228 nm] After Exposure, Neutralization |
|---|---|---|---|---|---|---|---|---|
| 1 | Control | C-1 | Non-exposed | 1.7 | 66.1 | — | — | — |
| 1 | Control | C-1 | Non-exposed, neutralized | 1.7 | 60.3 | 91 | — | — |
| 2 | Control | C-1 | Exposed | 43.7 | 0 | — | 100 | — |

TABLE II-continued

| Sample | Article | Polymer | Step | Abs × 10³ [at 228 nm] | Abs × 10³ [at 260 nm] | % Retained Non-exposed [at 260 nm] After Neutralization | % Conversion [at 260 nm] After Exposure | % Retained [at 228 nm] After Exposure, Neutralization |
|---|---|---|---|---|---|---|---|---|
| 3 | Control | C-1 | Exposed, neutralized | 8.3 | 0.4 | — | — | 15 |
| 4 | Invention | I-12 | Non-exposed | 0.5 | 73.8 | — | — | — |
| 4 | Invention | I-12 | Non-exposed, neutralized | 1.1 | 61.5 | 83 | — | — |
| 5 | Invention | I-12 | Exposed | 46.7 | 0.2 | — | 100 | — |
| 6 | Invention | I-12 | Exposed, neutralized | 48.2 | 0.9 | — | — | 81 |
| 7 | Invention | I-1 | Non-exposed | 1.7 | 65.2 | — | — | — |
| 7 | Invention | I-1 | Non-exposed, neutralized | 3.1 | 59.1 | 91 | — | — |
| 8 | Invention | I-1 | Exposed | 41.6 | 0.1 | — | 100 | — |
| 9 | Invention | I-1 | Exposed, neutralized | 52.3 | 0.2 | — | — | 99 |
| 10 | Invention | I-6 | Non-exposed | 11.0 | 61.6 | — | — | — |
| 10 | Invention | I-6 | Non-exposed, neutralized | 11.3 | 58.3 | 95 | — | — |
| 11 | Invention | I-6 | Exposed | 38.4 | 0.1 | — | 100 | — |
| 12 | Invention | I-6 | Exposed, neutralized | 48.8 | 0.4 | — | — | 100 |
| 13 | Control | C-2 | Non-exposed | 17.4 | 39.2 | — | — | — |
| 13 | Control | C-2 | Non-exposed, neutralized | 18.1 | 34.1 | 87 | — | — |
| 14 | Control | C-2 | Exposed | 23.2 | 0.3 | — | 99 | — |
| 15 | Control | C-2 | Exposed, neutralized | 26.6 | 0.1 | — | — | 90 |

The data in TABLE II show that both the non-exposed and exposed regions of the polymeric layer were substantially retained followed the neutralization treatment with sodium bicarbonate. Further, it is apparent that at least 10 mol % of -B- (Gm) crosslinkable recurring units are desired in the reactive polymer to retain greater that 80% of the reactive polymer film on the substrate following exposure and neutralization. Experiments 13-15 demonstrate that it is desirable in some embodiments that the reactive polymer comprise the -A- recurring units in an amount of greater than 50 mol % of the total recurring units to obtain desired ion exchange capacity. Lower amounts of the -A- recurring units may be useful in other experimental conditions. Thus, the inventive reactive polymer not only can serve as a thin film polymer resist but it can also be used as a patternable thin film ion exchanger material whose non-exposed regions remain as non-crosslinked with blocked aromatic sulfonic acid oxime ester groups and whose exposed regions are capable of use in ion exchange processes.

The % Conversion data shown in TABLE II were calculated at 260 nm as [1-(Neutralized/Initial)]×100. The % Retained data were calculated using the assumption that the 1.27 factor increase in Absorbance ("Abs") at 228 nm upon neutralization of the exposed 55/45 polymer (Invention Example 6) was due solely to the increased absorptivity of the neutralized sulfonate salt in the crosslinked polymer relative to the free sulfonic acid groups, and that this increased absorbance ratio was consistent for all ratios.

TABLE III

| Experiment | Polymer (TOSS nominal mol %) | Polymer Weight (g) | mmol of Acid | mmol of acid/g of polymer | Average mmol acid/g of polymer |
|---|---|---|---|---|---|
| 1 | 100 | 0.0030 | 0.0037 | 1.23 | 1.22 |
| 2 | 100 | 0.0030 | 0.0035 | 1.16 | |
| 3 | 100 | 0.0029 | 0.0037 | 1.27 | |
| 4 | 90 | 0.0031 | 0.0046 | 1.47 | 1.42 |
| 5 | 90 | 0.0034 | 0.0039 | 1.15 | |
| 6 | 90 | 0.0034 | 0.0055 | 1.63 | |
| 13 | 80 | 0.0032 | 0.0063 | 1.95 | 1.40 |
| 14 | 80 | 0.0033 | 0.0034 | 1.03 | |
| 15 | 80 | 0.0031 | 0.0044 | 1.43 | |
| 16 | 80 | 0.0033 | 0.0039 | 1.18 | |
| 7 | 50 | 0.0048 | 0.0031 | 0.65 | 0.66 |
| 8 | 50 | 0.0050 | 0.0028 | 0.56 | |
| 9 | 50 | 0.0048 | 0.0036 | 0.75 | |
| 10 | 20 | 0.0041 | 0.0026 | 0.64 | 0.45 |
| 11 | 20 | 0.0040 | 0.0015 | 0.37 | |
| 12 | 20 | 0.0044 | 0.0015 | 0.35 | |

The data presented in TABLE III demonstrate that sufficient amount of TOSS monomer (-A- recurring units) can be present to obtain desired ion exchange capacity as defined herein.

TABLE IV

| Polymer | Step | Polycationic Dye (shown below) | Abs × $10^2$ at 528 nm |
|---|---|---|---|
| C-1 | Non-exposed | A | 1.96 |
| C-1 | Exposed and neutralized | A | 17.30 |
| I-12 | Non-exposed | A | 0.64 |
| I-12 | Exposed and neutralized | A | 28.40 |
| I-1 | Non-exposed | A | 0.47 |
| I-1 | Exposed and neutralized | A | 27.84 |
| I-6 | Non-exposed | A | 0.37 |
| I-6 | Exposed and neutralized | A | 16.56 |
| C-2 | Non-exposed | A | 0.23 |
| C-2 | Exposed and neutralized | A | 2.04 |

The data in TABLE IV demonstrate that the reactive polymers of the present invention effectively function in the described articles as thin film ion exchange materials to exchange cationic dye with the pendant sodium salt groups in the exposed regions of the polymeric layer. While the Comparative C-1 polymer absorbed a considerable amount of the polycationic dye A in the exposed and neutralized regions of the polymeric layer, a considerable amount of the non-exposed polymer was readily washed off the substrate because it was not sufficiently crosslinked. Thus, it is important that the reactive polymer be able to both absorb the polycationic dye as well as be sufficiently de-blocked and crosslinked so it will remain adhered to the substrate during contact in aqueous-based solutions.

TABLE V

| Experiment | Polymer | UV Switch | Dye | Dye Charge | Number of (−) Silica Particles per 100 μm$^2$ | Number of (+) Silica Particles per 100 μm$^2$ |
|---|---|---|---|---|---|---|
| 1 | I-1 | No | None | — | 0 | 14 |
| 2 | I-1 | Yes | None | — | 0 | 9 |
| 3 | I-1 | No | F | +1 | 4 | 19 |
| 4 | I-1 | Yes | F | +1 | 0 | 19 |
| 5 | I-1 | No | G | +1 | 0 | 26 |
| 6 | I-1 | Yes | G | +1 | 0 | 25 |
| 7 | I-1 | No | A | +5 | 55 | 0 |
| 8 | I-1 | Yes | A | +5 | 0 | 12 |
| 9 | I-1 | No | B | +3 | 42 | 0 |
| 10 | I-1 | Yes | B | +3 | 0 | 18 |
| 11 | I-1 | No | C | +3 | 53 | 0 |
| 12 | I-1 | Yes | C | +3 | 0 | 21 |
| 13 | I-1 | No | D | +4 | 51 | 0 |
| 14 | I-1 | Yes | D | +4 | 0 | 17 |
| 15 | I-1 | No | E | +4 | 61 | 0 |
| 16 | I-1 | Yes | E | +4 | 0 | 19 |

The data in TABLE V indicate that for the separate articles of Control Experiments 1 and 2 using an inventive reactive polymer, both having been treated with the neutralization solution but not treated with a polycationic dye, no discrimination in particle adhesion was observed between the switched (exposed) and non-switched (non-exposed) polymers in the two different articles. The positively-charged silica particles remained adhered to both the switched and non-switched polymer layers. In contrast, the negatively-charged silica particles did not adhere to either the switched or non-switched polymer layers in these articles. Thus, it is clear that for the particular patterning method described herein, the reactive polymer must be used in combination with a polycationic dye that has a net positive charge greater than 2.

The data for Comparative Experiments 3-6 using an Inventive reactive polymer demonstrate the same lack of discrimination when a univalent cationic dye was used. Thus, the reactive polymers should be both de-blocked and crosslinked and used with a polycationic dye to provide desired discrimination.

The data for Inventive Experiments 7-15 demonstrate that following treatment with a polycationic dye, there was complete discrimination between the switched and non-switched polymeric layer formed using an inventive reactive polymer. That is, the negatively-charged silica particles adhered well to the dye-treated non-switched polymeric layer (containing reactive polymer) and were completely rejected by the dye-treated switched polymeric layer (containing crosslinked polymer derived from the reactive polymer of the present invention). The converse behavior was observed with use of the positively-charged silica particles.

Without being bound by any particular mechanistic explanation, it is believed that in the switched regions of the polymeric layer, the absorbed polycationic dye was insufficient to neutralize the large number of pendant sulfonate groups and the reactive polymer surface remained anionic. However, in the non-switched regions, without pendant sulfonate groups, the adsorbed polycationic dye rendered the polymeric layer surface cationic. The use of the polycationic dye therefore rendered the polymeric layer comprising the reactive polymer of this invention as patternable.

TABLE VI

| Experiment | Polymer | UV Switch (exposed?) | Dye | Charge on Dye | Number of (−) Silica Particles per 100 μm$^2$ |
|---|---|---|---|---|---|
| 1 | C-1 | No | A | +5 | 54 |
| 2 | C-1 | Yes | A | +5 | 0 |
| 3 | I-12 | No | A | +5 | 52 |
| 4 | I-12 | Yes | A | +5 | 0 |
| 5 | I-1 | No | A | +5 | 48 |
| 6 | I-1 | Yes | A | +5 | 0 |
| 7 | I-6 | No | A | +5 | 47 |
| 8 | I-6 | Yes | A | +5 | 0 |
| 9 | C-2 | No | A | +5 | 27 |
| 10 | C-2 | Yes | A | +5 | 0 |

The data in TABLE VI demonstrate that when using a cationic dye in the patterning process, adequate selectivity is best with an optimal molar ratio of the -A- and -B- recurring units in the reactive polymer as the polymer coatings obtained from Comparative C-1 and C-2 polymers did not show the desired selectivity.

The following cationic dyes were tested in the experiments described above. Dyes A through E are polycationic dyes that are useful in the patterning methods of this invention while Dyes F and G are univalent cationic dyes that are not useful in the present invention.

Dye A
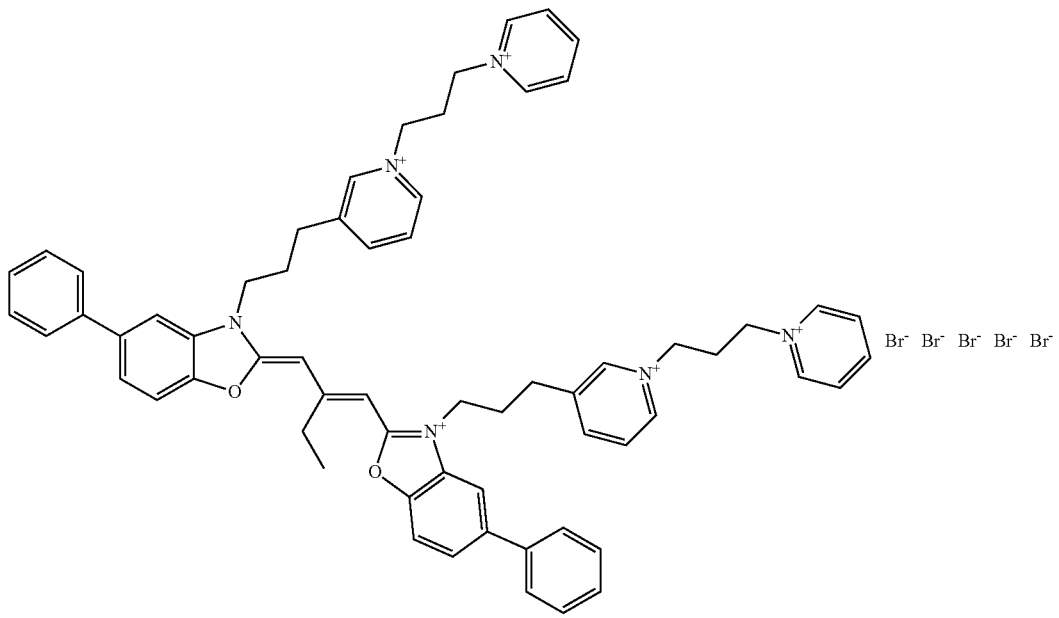
Dye B
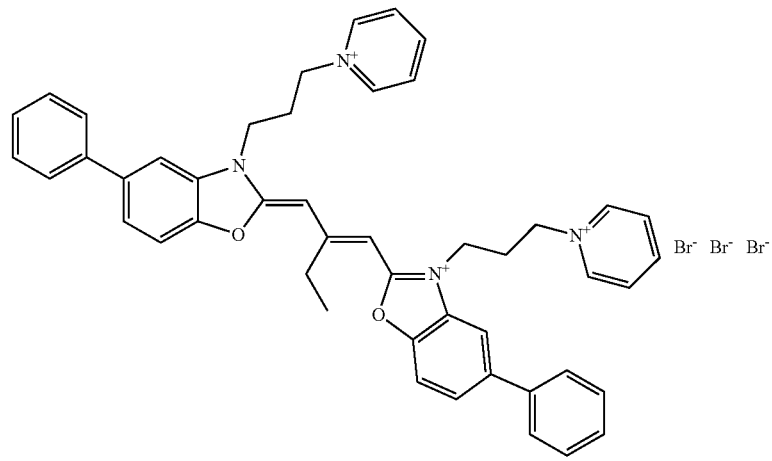
Dye C
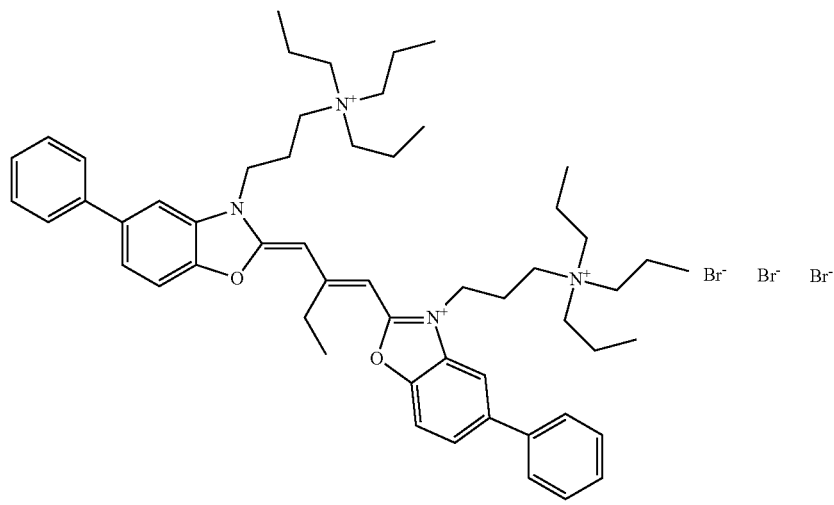

-continued
Dye D
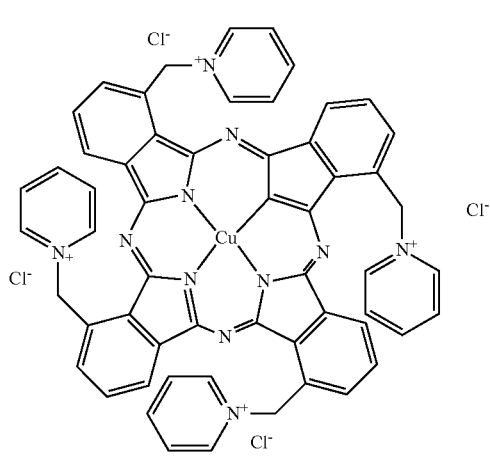
Dye E
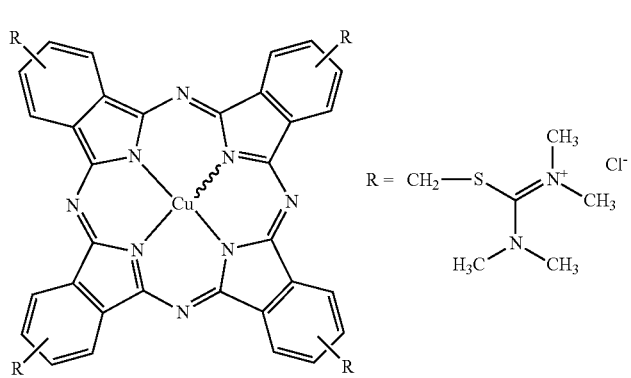
Dye F
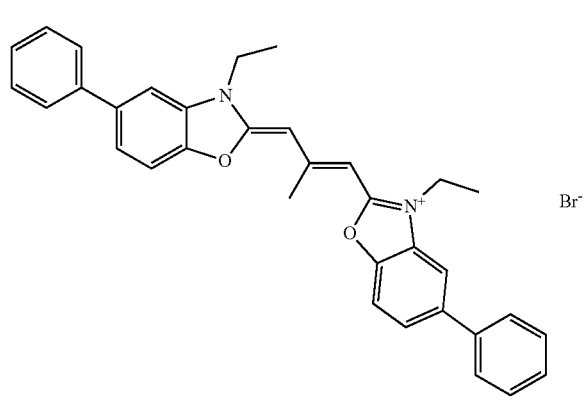
Dye G
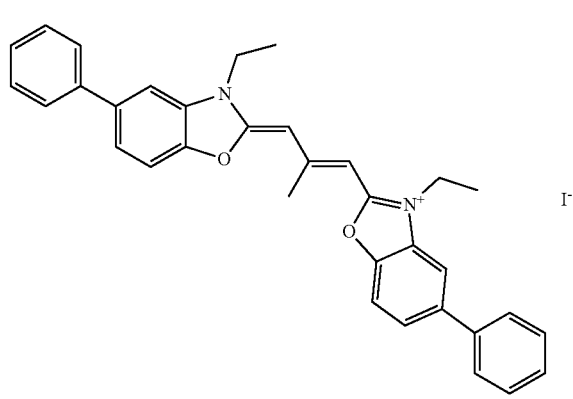

The invention has been described in detail with particular reference to certain preferred embodiments thereof, but it will be understood that variations and modifications can be effected within the spirit and scope of the invention.

The invention claimed is:

1. A method comprising:
providing a polymeric layer comprising a copolymer that comprises a backbone of at least -A- and -B- recurring units, all recurring units being arranged randomly along the backbone, wherein
the -A- recurring units comprise pendant groups that are capable of providing pendant aromatic sulfonic acid groups upon irradiation with radiation having a $\lambda_{max}$ of at least 150 nm and up to and including 450 nm, the -A- recurring units being present in the copolymer in an amount of up to and including 98 mol % based on total copolymer recurring units, and
the -B- recurring units comprise pendant groups that can provide crosslinking upon generation of the aromatic sulfonic acid groups in the -A- recurring units, the -B- recurring units being present in the copolymer in an amount of at least 2 mol %, based on total copolymer recurring units,
patternwise exposing the polymeric layer to radiation having a $\lambda_{max}$ of at least 150 nm and up to and including 450 nm to provide pendant sulfonic acid groups in the copolymer and to provide crosslinking in the copolymer in the exposed regions of the polymeric layer,
neutralizing the pendant sulfonic acid groups in the exposed regions of the polymeric layer to provide pendant neutralized sulfonic acid groups,
contacting both the exposed and non-exposed regions of the polymeric layer with a polycationic colorant that ionically binds to at least some of the pendant neutralized sulfonic acid groups in the exposed regions of the polymeric layer, and that adsorbs to the polymeric layer in the non-exposed regions, and
washing the polymeric layer with an aqueous solution to remove non-bound polycationic colorant from the exposed regions of the polymeric layer and non-adsorbed polycationic colorant from the non-exposed regions of the polymeric layer.

2. The method of claim 1, further comprising, after washing the polymeric layer:
contacting the polymeric layer with positively-charged colloidal particles that adhere to the exposed regions of the polymeric layer having adsorbed polycationic colorant, and
again washing the polymeric layer to remove non-adhering positively-charged colloidal particles from the non-exposed regions of the polymeric layer.

3. The method of claim 2, wherein the again washing is carried out at a pressure of at least 5 psi and up to and including 20 psi.

4. The method of claim 2, wherein the positively-charged colloidal particles have an average diameter of at least 0.2 µm and up to and including 8 µm.

5. The method of claim 2, wherein the positively-charged colloidal particles are metal ions.

6. The method of claim 5, wherein the positively-charged colloidal particles are silver ions, copper ions, platinum ions, nickel ions, palladium ions, iron ions, iridium ions, rhodium ions, or tin ions.

7. The method of claim 2, wherein the positively-charged colloidal particles are non-metallic organic polymeric particles having positively-charged surface groups, or inorganic particles having positively-charged surface groups.

8. The method of claim 1, further comprising after washing the polymeric layer:
contacting the polymeric layer with negatively-charged colloidal particles that adhere to the non-exposed regions of the polymeric layer, and
again washing the polymeric layer to remove non-adhering negatively-charged colloidal particles from the exposed regions of the polymeric layer.

9. The method of claim 8, wherein the negatively-charged colloidal particles have an average diameter of at least 0.2 µm and up to and including 8 µm.

10. The method of claim 8, wherein the negatively-charged colloidal particles are negatively-charged silica particles or organic polymeric particles having negatively-charged surface groups.

11. The method of claim 1, wherein the copolymer comprises -A- recurring units that are present in an amount of at least 50 mol % and up to and including 98 mol % based on total copolymer recurring units, and -B-recurring units that are present in an amount of at least 2 mol % and up to and including 50 mol % based on total copolymer recurring units.

12. The method of claim 1, wherein the -B- recurring units comprise pendant crosslinkable epoxy groups.

13. The method of claim 1, wherein the copolymer further comprises one or more additional recurring units that are different from all -A- and -B- recurring units in an amount of at least 3 mol % and up to and including 25 mol % based on the total copolymer recurring units.

14. The method of claim 1, wherein upon irradiation, the reactive polymer is capable of having an ion exchange capacity of at least 20% based on the theoretical ion exchange capacity of an irradiated homopolymer having only the same -A- recurring units.

15. The method of claim 1, wherein the polycationic colorant is a polycationic dye that is selected from the group consisting of a cyanine dye, merocyanine dye, acridine dye, polymethine dye, porphyrin dye, phthalocyanine dye, triarylmethane dye, and basic dye.

16. An intermediate article comprising a substrate and having disposed thereon a dry polymeric layer comprising exposed regions and non-exposed regions,
the exposed regions of the dry polymeric layer comprising a crosslinked and neutralized copolymer comprising reacted -A- recurring units and reacted -B- recurring units, and neutralized pendant sulfonic acid groups in the reacted -A- recurring units to which a polycationic colorant is ionically bound, and
the non-exposed regions of the dry polymeric layer comprising a non-crosslinked copolymer that comprises a backbone of at least -A- and -B- recurring units arranged randomly along the backbone, the -A- recurring units comprising pendant groups that are capable of providing pendant aromatic sulfonic acid groups upon irradiation at radiation having a $\lambda_{max}$ of at least 150 nm and up to and including 450 nm, the -A- recurring units being present in the copolymer in an amount of up to and including 98 mol % based on total copolymer recurring units, and the -B-recurring units comprising pendant groups that can provide crosslinking upon generation of the pendant aromatic sulfonic acid groups in the -A- recurring units, the -B- recurring units being present in an amount of at least 2 mol %, based on total copolymer recurring units, and
the non-exposed regions of the dry polymeric layer also having the polycationic colorant adsorbed thereto.

17. An article comprising a substrate and having disposed thereon a dry polymeric layer comprising exposed and non-exposed regions, the exposed regions of the dry polymeric layer comprising a crosslinked and neutralized copolymer comprising reacted -A- recurring units and reacted -B- recurring units, and neutralized pendant sulfonic acid groups in the reacted -A- recurring units to which a polycationic colorant is ionically bound, and the non-exposed regions of the dry polymeric layer comprising a non-crosslinked copolymer that comprises a backbone of at least -A- and -B- recurring units arranged randomly along the backbone, the -A- recurring units comprising pendant groups that are capable of providing pendant aromatic sulfonic acid groups upon irradiation to radiation having a $\lambda_{max}$ of at least 150 nm and up to and including 450 nm, the -A- recurring units being present in the non-crosslinked copolymer in an amount of up to and including 98 mol % based on total non-crosslinked copolymer recurring units, and the -B- recurring units comprising pendant groups that can provide crosslinking upon generation of the aromatic sulfonic acid groups in the -A-recurring units, the -B- recurring units being present in the non-crosslinked copolymer in an amount of at least 2 mol %, based on total non-crosslinked copolymer recurring units, and the non-exposed regions of the dry polymeric layer further comprising negatively-charged colloidal particles and adsorbed polycationic colorant.

18. An article comprising a substrate and having disposed thereon a dry polymeric layer comprising exposed and non-exposed regions, the exposed regions of the dry polymeric layer comprising a crosslinked and neutralized copolymer comprising neutralized pendant sulfonic acid groups to which are adhered positively-charged colloidal particles, and the non-exposed regions of the dry polymeric layer comprising a non-crosslinked copolymer that comprises a backbone of at least -A- and -B- recurring units arranged randomly along the backbone, the -A- recurring units comprising pendant groups that are capable of providing pendant aromatic sulfonic acid groups upon irradiation with radiation having a $\lambda_{max}$ of at least 150 nm and up to and including 450 nm, the -A- recurring units being present in the non-crosslinked copolymer in an amount of up to and including 98 mol % based on total non-crosslinked copolymer recurring units, and the -B- recurring units comprising groups that can provide crosslinking upon generation of the aromatic sulfonic acid groups in the -A- recurring units, the -B- recurring units being present in the non-crosslinked copolymer in an amount of at least 2 mol %, based on total non-crosslinked copolymer recurring units, and the non-exposed regions of the dry polymeric layer further comprising adsorbed polycationic colorant.

* * * * *